(12) United States Patent
Yoshikawa et al.

(10) Patent No.: US 10,665,731 B2
(45) Date of Patent: May 26, 2020

(54) PHOTOELECTRIC CONVERSION ELEMENT

(71) Applicant: SHARP KABUSHIKI KAISHA, Sakai, Osaka (JP)

(72) Inventors: Yasushi Yoshikawa, Sakai (JP); Takayuki Isaka, Sakai (JP); Chikao Okamoto, Sakai (JP)

(73) Assignee: SHARP KABUSHIKI KAISHA, Sakai, Osaka (JP)

( * ) Notice: Subject to any disclaimer, the term of this patent is extended or adjusted under 35 U.S.C. 154(b) by 0 days.

(21) Appl. No.: 15/740,772

(22) PCT Filed: Jun. 27, 2016

(86) PCT No.: PCT/JP2016/068969
§ 371 (c)(1),
(2) Date: Dec. 28, 2017

(87) PCT Pub. No.: WO2017/002747
PCT Pub. Date: Jan. 5, 2017

(65) Prior Publication Data
US 2018/0190839 A1    Jul. 5, 2018

(30) Foreign Application Priority Data
Jun. 30, 2015 (JP) .................. 2015-131740

(51) Int. Cl.
*H01L 31/0216* (2014.01)
*H01L 31/0224* (2006.01)
*H01L 31/068* (2012.01)

(52) U.S. Cl.
CPC .... *H01L 31/0216* (2013.01); *H01L 31/02167* (2013.01); *H01L 31/022425* (2013.01); *H01L 31/022441* (2013.01); *H01L 31/068* (2013.01); *H01L 31/0682* (2013.01); *Y02E 10/50* (2013.01)

(58) Field of Classification Search
None
See application file for complete search history.

(56) References Cited

U.S. PATENT DOCUMENTS

| | | | |
|---|---|---|---|
| 4,927,770 A | 5/1990 | Swanson | |
| 2004/0259335 A1* | 12/2004 | Narayanan | H01L 31/068 438/584 |
| 2006/0102972 A1* | 5/2006 | Bhattacharyya | H01L 31/022425 257/432 |
| 2010/0139740 A1* | 6/2010 | Xavier | H01L 31/02167 136/251 |
| 2010/0139745 A1 | 6/2010 | Cousins | |

(Continued)

FOREIGN PATENT DOCUMENTS

| | | |
|---|---|---|
| CN | 102738288 A | 10/2012 |
| CN | 202601572 U | 12/2012 |

(Continued)

*Primary Examiner* — Eli S Mekhlin
(74) *Attorney, Agent, or Firm* — ScienBiziP, P.C.

(57) ABSTRACT

A photoelectric conversion element includes a composite passivation film disposed on a second surface of a semiconductor substrate that is opposite to a first surface on which light is incident. The composite passivation film includes a first passivation film having negative fixed charges and a protection film that protects the first passivation film. This allows the carrier collection efficiency of the photoelectric conversion element to be improved.

18 Claims, 13 Drawing Sheets

(56) References Cited

U.S. PATENT DOCUMENTS

| | | | | |
|---|---|---|---|---|
| 2011/0041911 A1* | 2/2011 | Lee | ................ | H01L 31/022425 |
| | | | | 136/256 |
| 2013/0188903 A1* | 7/2013 | Sandhu | ................ | G02B 6/1223 |
| | | | | 385/14 |
| 2013/0206222 A1* | 8/2013 | Ha | .................... | H01L 31/02168 |
| | | | | 136/256 |
| 2014/0083498 A1 | 3/2014 | Lee et al. | | |
| 2015/0179829 A1* | 6/2015 | Tanaka | .............. | H01L 31/02167 |
| | | | | 136/256 |

FOREIGN PATENT DOCUMENTS

| | | |
|---|---|---|
| JP | 2008-010746 A | 1/2008 |
| JP | 2013-004889 A | 1/2013 |
| JP | 2014-056875 A | 3/2014 |
| JP | 2014-072530 A | 4/2014 |

\* cited by examiner

PHOTOELECTRIC CONVERSION ELEMENT

TECHNICAL FIELD

The present invention relates to a photoelectric conversion element.

BACKGROUND ART

In recent years, from the viewpoint of global environmental problems, photoelectric conversion elements that convert the energy of light such as sunlight to electric energy are increasingly expected to be next-generation energy sources. One known photoelectric conversion element adapted to improve efficiency in converting light energy into electric energy has a back contact structure in which electrodes are formed only on a back surface opposite to a light incident surface (see, for example, PTL 1).

CITATION LIST

Patent Literature

PTL 1: U.S. Pat. No. 4,927,770

SUMMARY OF INVENTION

Technical Problem

However, in the photoelectric conversion element described in PTL 1, the efficiency in collecting carriers generated in the photoelectric conversion element when the photoelectric conversion element is irradiated with light is not sufficiently high.

The present invention has been made in view of the above problem, and it is an object of the invention to provide a photoelectric conversion element having improved carrier collection efficiency.

Solution to Problem

The photoelectric conversion element of the present invention comprises a semiconductor substrate having a first surface on which light is incident, a second surface opposite to the first surface, and a side surface that connects the first surface to the second surface. The semiconductor substrate includes an n-type impurity diffusion layer and a p-type impurity diffusion layer that are located in the second surface. The photoelectric conversion element in the present embodiment further comprises a composite passivation film disposed on the second surface. The composite passivation film includes a first passivation film having negative fixed charges and a protection film that protects the first passivation film. The photoelectric conversion element in the present embodiment further comprises a first electrode disposed on the second surface and electrically connected to the n-type impurity diffusion layer and a second electrode disposed on the second surface and electrically connected to the p-type impurity diffusion layer.

Advantageous Effects of Invention

In the photoelectric conversion element of the present invention, the carrier collection efficiency of the photoelectric conversion element provided can be improved.

DESCRIPTION OF EMBODIMENTS

Embodiment 1

Figure 1:
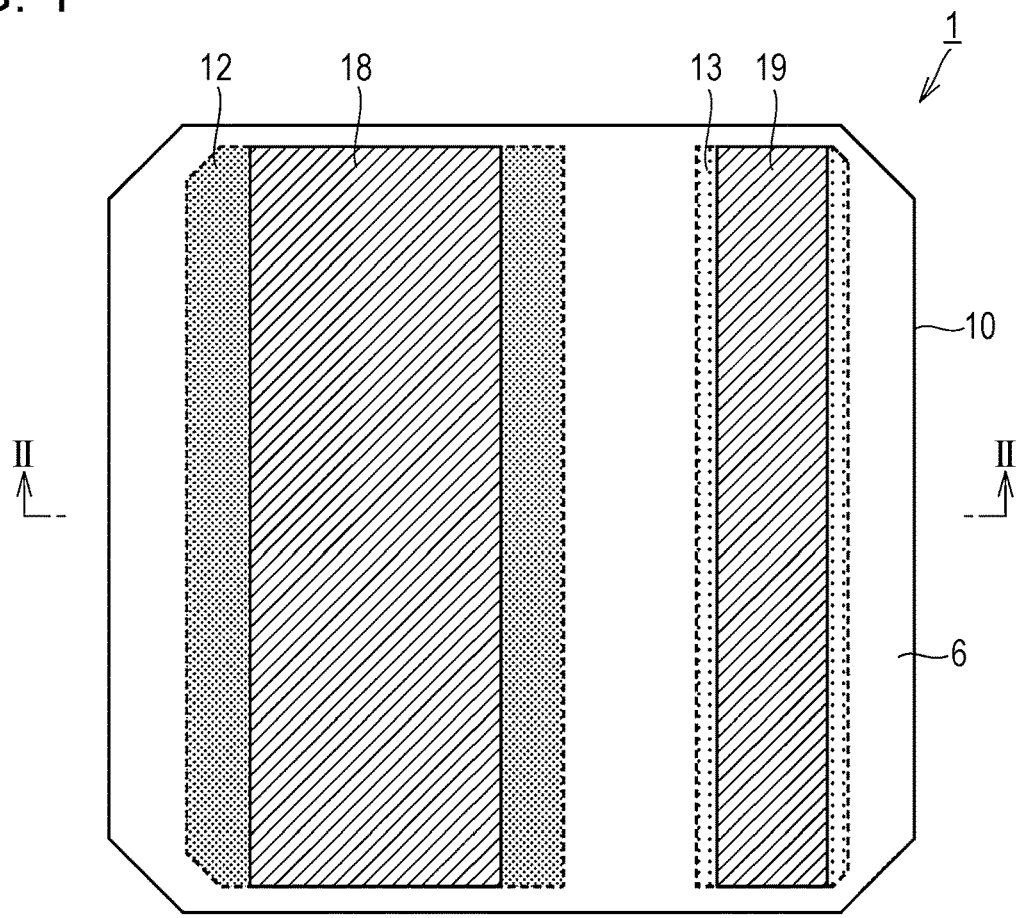
FIG. 1 is a schematic plan view of a photoelectric conversion element according to embodiment 1, the photoelectric conversion element being viewed from its second surface side.
Figure 2:
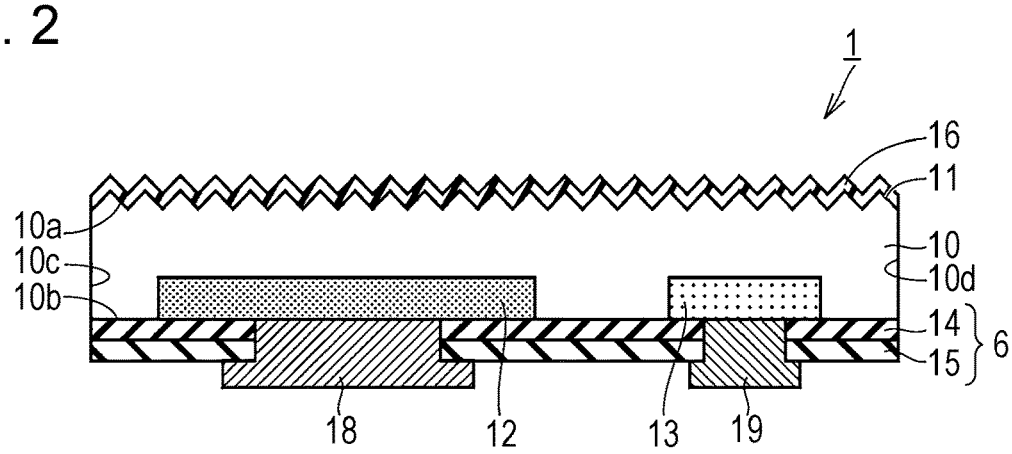
FIG. 2 is a schematic cross-sectional view of the photoelectric conversion element according to embodiment 1, the cross-sectional view being taken along section line II-II shown in FIG. 1.

Referring to FIGS. 1 and 2, a photoelectric conversion element 1 according to embodiment 1 will be described.

The photoelectric conversion element 1 in the present embodiment mainly includes: a semiconductor substrate 10 including an n-type impurity diffusion layer 13 and a p-type impurity diffusion layer 12; a composite passivation film 6; a first electrode 19 electrically connected to the n-type impurity diffusion layer 13; and a second electrode 18 electrically connected to the p-type impurity diffusion layer 12.

The semiconductor substrate 10 may be an n-type or p-type semiconductor substrate. The semiconductor substrate 10 may be a polycrystalline silicon substrate or a single crystal silicon substrate. In the present embodiment, the semiconductor substrate 10 used is an n-type silicon substrate. The semiconductor substrate 10 has a first surface 10a, a second surface 10b opposite to the first surface 10a, and side surfaces (e.g., a first side surface 10c and a second side surface 10d) that connect the first surface 10a to the second surface 10b. In the present description, the side surfaces of the semiconductor substrate 10 further include side surfaces other than the first side surface 10c and the second side surface 10d (e.g., side surfaces extending in a direction intersecting the first side surface 10c and the second side surface 10d (the left-right direction in FIG. 1)). Light enters the photoelectric conversion element 1 from the first surface 10a side of the semiconductor substrate 10. The first surface 10a of the semiconductor substrate 10 is a light-receiving surface. A textured structure 11 may be formed on the first surface 10a of the semiconductor substrate 10. When the first surface 10a of the semiconductor substrate 10 that serves as a light-incident surface is textured, reflection of light from the first surface 10a of the semiconductor substrate 10 is reduced, and a larger amount of light can enter the photoelectric conversion element 1. This can improve the efficiency in converting light energy into electric energy in the photoelectric conversion element 1.

The semiconductor substrate 10 includes the n-type impurity diffusion layer 13 and the p-type impurity diffusion layer 12 that are located in the second surface 10b. The n-type impurity diffusion layer 13 is a layer formed by diffusing an n-type impurity such as phosphorus into the semiconductor substrate 10. The p-type impurity diffusion layer 12 is a layer formed by diffusing a p-type impurity such as boron into the semiconductor substrate 10.

A second passivation film 16 may be provided on the first surface 10a of the semiconductor substrate 10. The second passivation film 16 may be formed of silicon nitride ($SiN_{x4}$) or hydrogenated silicon nitride ($SiN_{x4}$:H). The second passivation film 16 may have a refractive index between the refractive index of the semiconductor substrate 10 and the refractive index of a material such as air present around the photoelectric conversion element 1. When the refractive index of the second passivation film 16 is between the refractive index of the semiconductor substrate 10 and the refractive index of the material such as air present around the photoelectric conversion element 1, the second passivation film 16 can serve as an antireflection coating. In this case, the reflectivity of light from the photoelectric conversion element 1 is reduced, and a larger amount of light can enter the photoelectric conversion element 1. The efficiency in converting light energy into electric energy in the photoelectric conversion element 1 can thereby be improved.

The composite passivation film 6 is disposed on the second surface 10b of the semiconductor substrate 10. In the present embodiment, the composite passivation film 6 includes a first passivation film 14 having negative fixed charges and a protection film 15 that protects the first passivation film 14. On the second surface 10b of the semiconductor substrate 10, the protection film 15 covers the first passivation film 14. The first passivation film 14 is located between the second surface 10b of the semiconductor substrate 10 and the protection film 15.

The first passivation film 14 having negative fixed charges may be formed of aluminum oxide ($AlO_{x1}$) or hydrogenated aluminum oxide ($AlO_{x1}$:H). The first passivation film 14 may have a film thickness of, for example, from 3 nm to 100 nm inclusive.

The protection film 15 is disposed on the first passivation film 14 to protect the first passivation film 14. The protection film 15 may mechanically protect the first passivation film 14 from, for example, an impact applied from the outside of the semiconductor substrate 10. The protection film 15 may prevent the first passivation film 14 from being peeled off the semiconductor substrate 10 during a production process of the photoelectric conversion element 1 and after its production. The protection film 15 may be formed of silicon oxide ($SiO_{x3}$), silicon nitride ($SiN_{x3}$), or hydrogenated silicon nitride ($SiN_{x3}$:H).

The first electrode 19 and the second electrode 18 are disposed on the second surface 10b of the semiconductor substrate 10. The first electrode 19 is electrically connected to the n-type impurity diffusion layer 13 through a through hole 17 (see FIG. 14) formed in the composite passivation film 6. The first electrode 19 serves as an n-type electrode. The second electrode 18 is electrically connected to the p-type impurity diffusion layer 12 through a through hole 17 (see FIG. 14) formed in the composite passivation film 6. The second electrode 18 serves as a p-type electrode. Since the first electrode 19 and the second electrode 18 are disposed on the second surface 10b opposite to the first surface 10a on which light is incident, the light entering the photoelectric conversion element 1 is not reflected from the first electrode 19 and the second electrode 18. The photoelectric conversion element 1 in the present embodiment is a back-junction photoelectric conversion element. In FIGS. 1 and 2, only one p-type impurity diffusion layer 12, one n-type impurity diffusion layer 13, one first electrode 19, and one second electrode 18 are shown. However, the photoelectric conversion element 1 may include a plurality of p-type impurity diffusion layers 12, a plurality of n-type impurity diffusion layers 13, a plurality of first electrodes 19, and a plurality of second electrodes 18. In the photoelectric conversion element 1 shown in FIGS. 1 and 2, the first electrode 19 is formed on the first side surface 10c side of the second surface 10b, and the second electrode 18 is formed in an edge portion on the second side surface 10d side of the second surface 10b. However, a first electrode 19 may be formed in an edge portion on the first side surface 10c side of the second surface 10b, and another first electrode 19 may be formed 10b in an edge portion on the second side surface 10d on the second surface. In this case, the second electrode 18 may be formed on the second surface 10b in a region between the first electrodes 19. Alternatively, a second electrode 18 may be formed in an edge portion on the first side surface 10c side of the second surface 10b, and another second electrode 18 may be formed in an edge portion on the second side surface 10d of the second surface 10b. In this case, the first electrode 19 may be formed on the second surface 10b in a region between the second electrodes 18.

Referring to FIGS. 3 to 14, an example of a method for producing the photoelectric conversion element 1 according to the present embodiment will be described.

Figure 3:
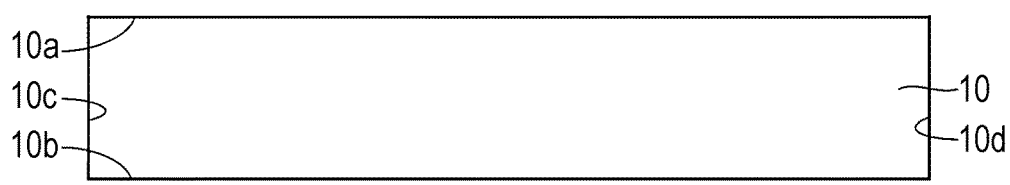
FIG. 3 is a schematic cross-sectional view showing a step in a method of producing the photoelectric conversion element according to embodiment 1.

Referring to FIG. 3, the semiconductor substrate 10 is prepared. The semiconductor substrate 10 has the first surface 10a, the second surface 10b opposite to the first surface 10a, the side surfaces (the first side surface 10c and the second side surface 10d) that connect the first surface 10a to the second surface 10b. In the present embodiment, the semiconductor substrate 10 is an n-type silicon substrate. The semiconductor substrate 10 used is, for example, a semiconductor substrate from which saw damage has been removed. The saw damage is produced when a semiconductor wafer is sliced to obtain the semiconductor substrate 10. To remove the saw damage to the semiconductor substrate 10, the surface of the semiconductor substrate 10 may be etched with an acid mixture of an aqueous hydrogen fluoride solution and nitric acid, an alkaline aqueous solution such as sodium hydroxide, etc.

Figure 4:
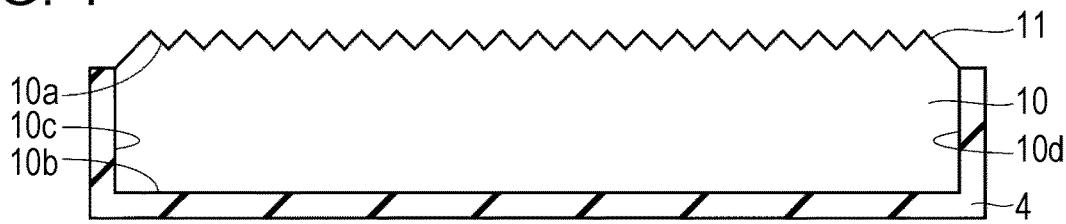
FIG. 4 is a schematic cross-sectional view showing the step next to the step shown in FIG. 3 in the method of producing the photoelectric conversion element according to embodiment 1.

Referring to FIG. 4, the textured structure 11 is formed on the first surface 10a of the semiconductor substrate 10. For example, the second surface 10b, first side surface 10c, and second side surface 10d of the semiconductor substrate 10, which is an n-type silicon substrate, are coated with an etching protection film 4. One example of the etching protection film 4 is a silicon oxide film. In the present embodiment, the silicon oxide film is formed on the second surface 10b, first side surface 10c, and second side surface 10d of the semiconductor substrate 10 using a chemical vapor deposition (CVD) method or a spin-on-glass (SOG) method, and the etching protection film 4 is thereby formed. The etching protection film 4 may be formed by oxidizing the second surface 10b, first side surface 10c, and second side surface 10d of the semiconductor substrate 10 using, for example, a steam oxidation method. No particular limitation is imposed on the thickness of the etching protection film 4. The thickness may be, for example, from 300 nm to 800 nm inclusive. The etching protection film 4 used may be, for example, a silicon nitride film or a stack of a silicon oxide film and a silicon nitride film. The silicon nitride film may be formed by, for example, a plasma CVD method or an atmospheric pressure CVD method. No particular limitation is imposed on the thickness of the silicon nitride film. The thickness may be, for example, from 60 nm to 100 nm inclusive.

Then the first surface 10a of the semiconductor substrate 10, which is an n-type silicon substrate, may be etched to thereby form the textured structure 11 on the first surface 10a of the semiconductor substrate 10. The etching may be performed using a solution prepared by adding isopropyl alcohol to an alkaline aqueous solution such as potassium hydroxide (KOH) or sodium hydroxide (NaOH) and then heating the mixture to, for example, from 70° C. to 80° C. inclusive. Then the etching protection film 4 on the second surface 10b, first side surface 10c, and second side surface 10d of the semiconductor substrate 10 is removed using, for example, an aqueous hydrogen fluoride solution.

Figure 5:
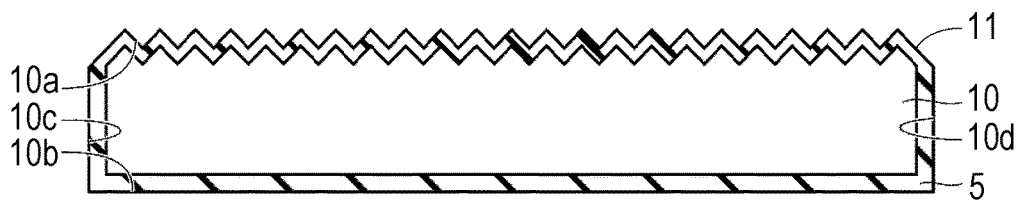
FIG. 5 is a schematic cross-sectional view showing the step next to the step shown in FIG. 4 in the method of producing the photoelectric conversion element according to embodiment 1.

Referring to FIG. 5, a first diffusion-preventing mask 5 is formed on the first surface 10a, second surface 10b, first side surface 10c, and second side surface 10d of the semiconductor substrate 10. The first diffusion-preventing mask 5 is a mask for preventing a p-type impurity from diffusing into the semiconductor substrate 10. One example of the first diffusion-preventing mask 5 is a silicon oxide film. The first diffusion-preventing mask 5 may be formed by thermally oxidizing the first surface 10a, second surface 10b, first side surface 10c, and second side surface 10d of the semiconductor substrate 10 using, for example, a steam oxidation method. No particular limitation is imposed on the thickness of the first diffusion-preventing mask 5. The thickness may be, for example, from 100 nm to 300 nm inclusive. The first diffusion-preventing mask 5 used may be, for example, a silicon nitride film or a stack of a silicon oxide film and a silicon nitride film. The silicon nitride film may be formed using, for example, a plasma CVD method or an atmospheric pressure CVD method. No particular limitation is imposed on the thickness of the silicon nitride film. The thickness may be, for example, from 40 nm to 80 nm inclusive.

Figure 6:
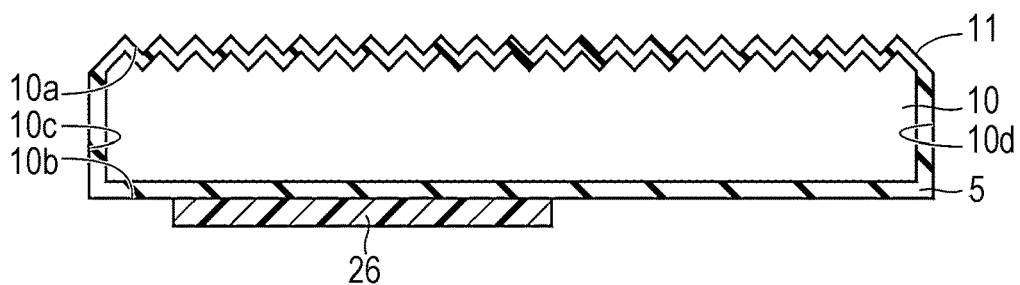
FIG. 6 is a schematic cross-sectional view showing the step next to the step shown in FIG. 5 in the method of producing the photoelectric conversion element according to embodiment 1.

Referring to FIG. 6, a first etching paste 26 containing a component capable of etching the first diffusion-preventing mask 5 is printed on part of the first diffusion-preventing mask 5 on the second surface 10b of the semiconductor substrate 10. The first etching paste 26 is formed by, for example, a screen printing method on a portion of the first diffusion-preventing mask 5 that corresponds to a region in which the p-type impurity diffusion layer 12 is to be formed. One example of the component that is contained in the first etching paste 26 and etches the first diffusion-preventing mask 5 is phosphoric acid. The first etching paste 26 further contains water, an organic solvent, and a thickener.

Figure 7:
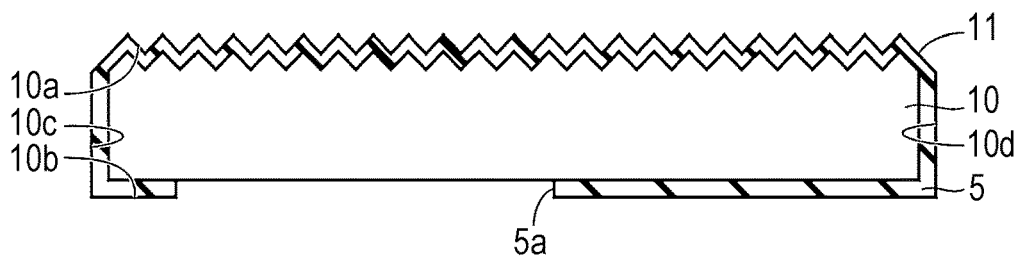
FIG. 7 is a schematic cross-sectional view showing the step next to the step shown in FIG. 6 in the method of producing the photoelectric conversion element according to embodiment 1.

Referring to FIG. 7, the semiconductor substrate 10 with the first etching paste 26 formed thereon is subjected to first heat treatment to etch and remove the portion of the first diffusion-preventing mask 5 which is on the second surface 10b of the semiconductor substrate 10 and on which the first etching paste 26 has been formed. After the first heat treatment, the second surface 10b of the semiconductor substrate 10 is washed with water, and the first etching paste 26 is thereby removed. As shown in FIG. 7, part of the first diffusion-preventing mask 5 is removed as described above, and an opening 5a is formed in part of the first diffusion-preventing mask 5. In the opening 5a of the first diffusion-preventing mask 5, part of the second surface 10b of the semiconductor substrate 10 is exposed from the first diffusion-preventing mask 5.

Figure 8:
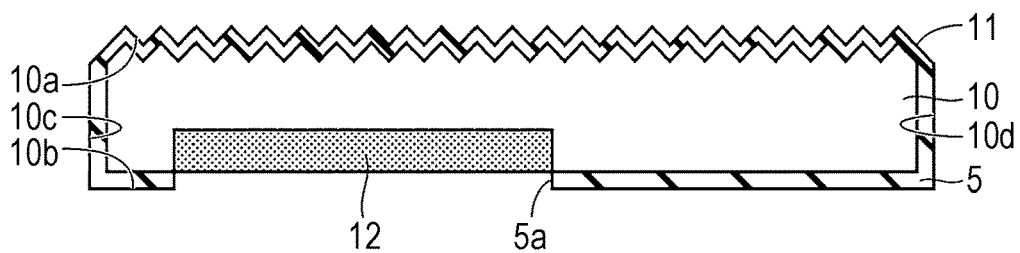
FIG. 8 is a schematic cross-sectional view showing the step next to the step shown in FIG. 7 in the method of producing the photoelectric conversion element according to embodiment 1.

Referring to FIG. 8, a p-type impurity is diffused into a portion of the second surface 10b of the semiconductor substrate 10 which portion is exposed from the first diffusion-preventing mask 5, and the p-type impurity diffusion layer 12 is thereby formed. For example, the p-type impurity diffusion layer 12 may be formed by using vapor phase diffusion of $BBr_3$ to diffuse boron, which is a p-type impurity, into the portion of the second surface 10b of the semiconductor substrate 10 which portion is exposed from the first diffusion-preventing mask 5 at a temperature of 950° C. for 30 minutes. The p-type impurity diffusion layer 12 may be formed by applying a solvent containing boron to the portion of the second surface of the semiconductor substrate 10 which portion is exposed from the first diffusion-preventing mask 5 and then heating the semiconductor substrate 10 coated with the solvent containing boron. Then the first diffusion-preventing mask 5 is removed using, for example, an aqueous hydrogen fluoride solution.

Figure 9:
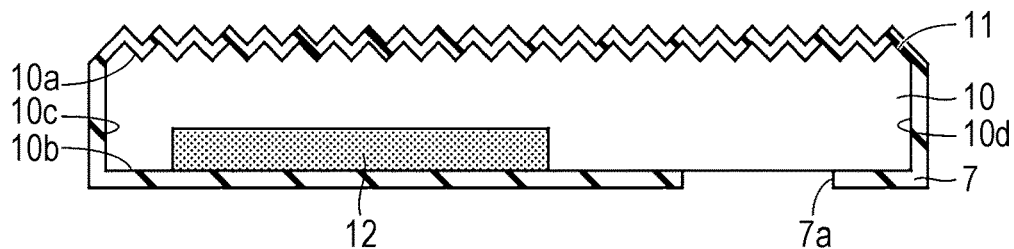
FIG. 9 is a schematic cross-sectional view showing the step next to the step shown in FIG. 8 in the method of producing the photoelectric conversion element according to embodiment 1.

Referring to FIG. 9, a second diffusion-preventing mask 7 is formed on the first surface 10a, second surface 10b, first side surface 10c, and second side surface 10d of the semiconductor substrate 10. The second diffusion-preventing mask 7 is a mask for preventing an n-type impurity from diffusing into the semiconductor substrate 10. The second diffusion-preventing mask 7 covers the p-type impurity diffusion layer 12 in the second surface 10b of the semiconductor substrate 10. The second diffusion-preventing mask 7 covers also the side surfaces (e.g., the first side surface 10c and the second side surface 10d) of the semiconductor substrate 10. The second diffusion-preventing mask 7 has an opening 7a on the second surface 10b of the semiconductor substrate 10. A region of the second surface 10b of the semiconductor substrate 10 which region corresponds to the opening 7a of the second diffusion-preventing mask 7 is exposed from the second diffusion-preventing mask 7. In plan view from the second surface 10b side of the semiconductor substrate 10, the opening 7a of the second diffusion-preventing mask 7 is formed in a portion that does not overlap the p-type impurity diffusion layer 12.

The second diffusion-preventing mask 7 may be formed using a masking paste. For example, a masking paste containing a silicon dioxide ($SiO_2$) precursor is printed by, for example, a screen printing method on the first surface 10a, second surface 10b, first side surface 10c, and second side surface 10d of the semiconductor substrate 10. The masking paste on the second surface 10b of the semiconductor substrate 10 has an opening. The semiconductor substrate 10 with the masking paste printed thereon is heated to, for example, from 800° C. to 1,000° C. inclusive for from 10 minutes to 60 minutes inclusive to sinter the masking paste, and the second diffusion-preventing mask 7 is thereby formed. When the masking paste is used to form the second diffusion-preventing mask 7 having the opening 7a, the photoelectric conversion element 1 can be produced at lower cost than when photolithography is used to produce the second diffusion-preventing mask 7 having the opening 7a.

Figure 10:
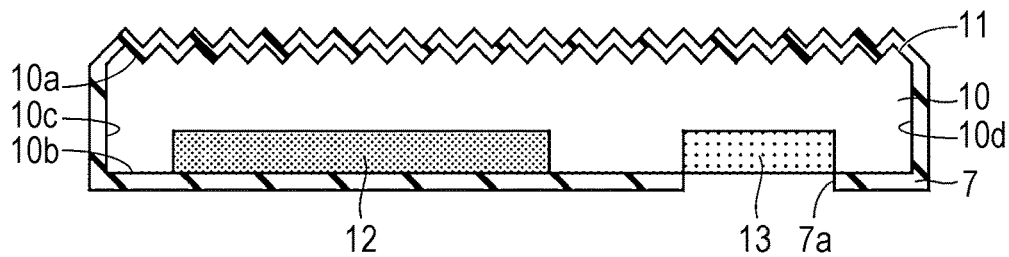
FIG. 10 is a schematic cross-sectional view showing the step next to the step shown in FIG. 9 in the method of producing the photoelectric conversion element according to embodiment 1.

Referring to FIG. 10, an n-type impurity is diffused into a portion of the second surface 10b of the semiconductor substrate 10 which portion is exposed from the second diffusion-preventing mask 7, and the n-type impurity diffusion layer 13 is thereby formed. For example, the n-type impurity diffusion layer 13 may be formed by using vapor phase diffusion of $POCl_3$ to diffuse phosphorus, which is an n-type impurity, into the portion of the second surface 10b of the semiconductor substrate 10 which portion is exposed from the second diffusion-preventing mask 7 at a temperature of 800° C. for 30 minutes. The n-type impurity diffusion layer 13 may be formed by applying a solvent containing phosphorus to the portion of the second surface 10b of the semiconductor substrate 10 which portion is exposed from the second diffusion-preventing mask 7 and then heating the semiconductor substrate 10 coated with the solvent containing phosphorus. Then the second diffusion-preventing mask 7 is removed using, for example, an aqueous hydrogen fluoride solution.

Figure 11:
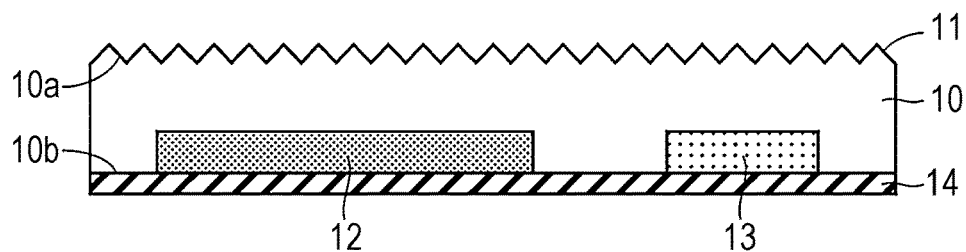
FIG. 11 is a schematic cross-sectional view showing the step next to the step shown in FIG. 10 in the method of producing the photoelectric conversion element according to embodiment 1.
Figure 12:
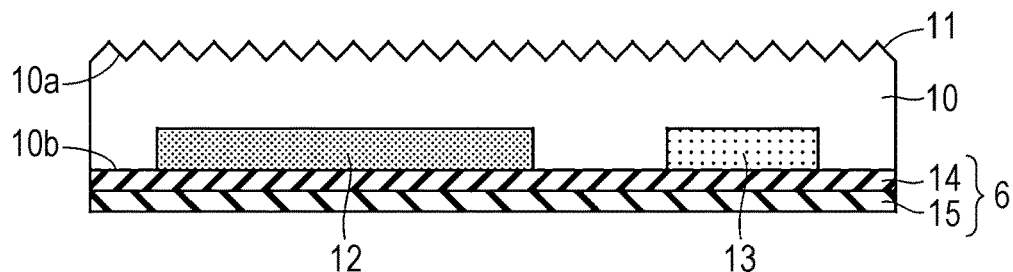
FIG. 12 is a schematic cross-sectional view showing the step next to the step shown in FIG. 11 in the method of producing the photoelectric conversion element according to embodiment 1.

Referring to FIGS. 11 and 12, the composite passivation film 6 is formed on the second surface 10b of the semiconductor substrate 10 including the p-type impurity diffusion layer 12 and the n-type impurity diffusion layer 13 formed by diffusion. Specifically, referring to FIG. 11, the first passivation film 14 is formed on the second surface 10b of the semiconductor substrate 10 including the p-type impurity diffusion layer 12 and the n-type impurity diffusion layer 13 formed by diffusion. The first passivation film 14 is formed of a material having negative fixed charges. The first passivation film 14 may be formed of aluminum oxide ($AlO_{x1}$) or hydrogenated aluminum oxide ($AlO_{x1}$:H). The first passivation film 14 may be formed using, for example, an atomic layer deposition (ALD) method, a sputtering method, or a plasma CVD method. Referring to FIG. 12, the protection film 15 is formed on the first passivation film 14. The protection film 15 protects the first passivation film 14. The protection film 15 may be formed of silicon oxide ($SiO_{x3}$), silicon nitride ($SiN_{x3}$), or hydrogenated silicon nitride ($SiN_{x3}$:H). The protection film 15 may be formed using, for example, a chemical vapor deposition (CVD) method or a sputtering method.

Figure 13:
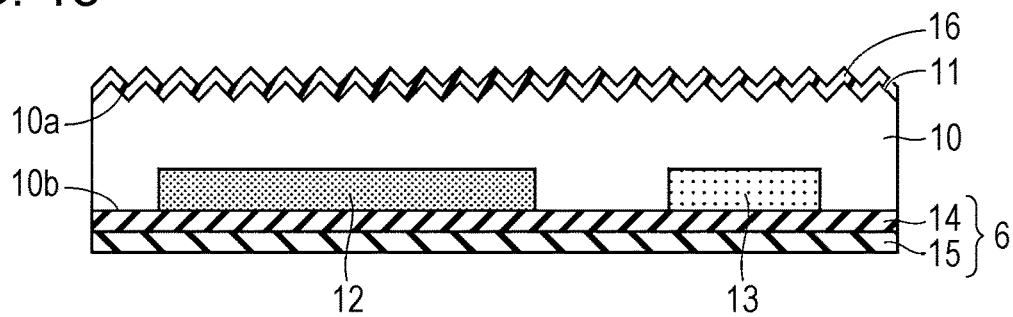
FIG. 13 is a schematic cross-sectional view showing the step next to the step shown in FIG. 12 in the method of producing the photoelectric conversion element according to embodiment 1.

Referring to FIG. 13, the second passivation film 16 may be formed on the first surface 10a of the semiconductor substrate 10. The second passivation film 16 may be formed using, for example, a chemical vapor deposition (CVD) method or a sputtering method. The second passivation film 16 may have a refractive index between the refractive index of the semiconductor substrate 10 and the refractive index of a material such as air present around the photoelectric conversion element 1 and may function as an antireflection coating.

Figure 14:
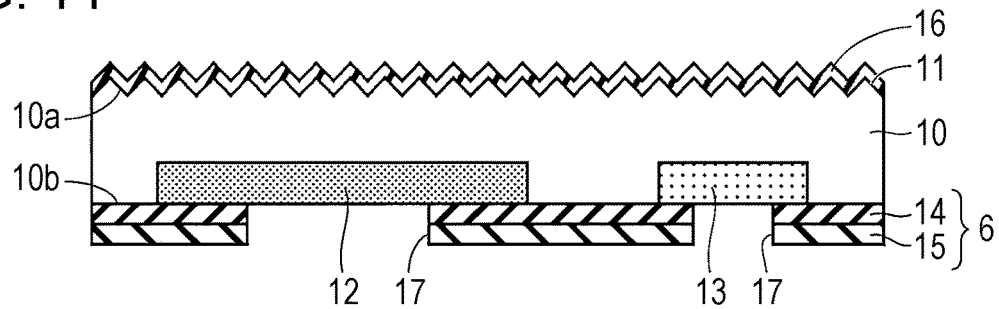
FIG. 14 is a schematic cross-sectional view showing the step next to the step shown in FIG. 13 in the method of producing the photoelectric conversion element according to embodiment 1.

Referring to FIG. 14, through holes 17 are formed in the composite passivation film 6. Then the first electrode 19 and the second electrode 18 are formed on the composite passivation film 6. The second electrode 18 is formed in one of the through holes 17 and electrically connected to the p-type impurity diffusion layer 12. The first electrode 19 is formed in the other through hole 17 and electrically connected to the n-type impurity diffusion layer 13. The photoelectric conversion element 1 in the present embodiment that is shown in FIGS. 1 and 2 can thereby be produced.

The effects of the photoelectric conversion element 1 in the present embodiment will be described.

The photoelectric conversion element 1 in the present embodiment includes the semiconductor substrate 10 having the first surface 10a on which light is incident, the second surface 10b opposite to the first surface 10a, and the side surfaces (e.g., the first side surface 10c and the second side surface 10d) that connect the first surface 10a to the second surface 10b. The semiconductor substrate 10 includes the n-type impurity diffusion layer 13 and the p-type impurity diffusion layer 12 that are located in the second surface 10b. The photoelectric conversion element 1 in the present embodiment further includes the composite passivation film 6 disposed on the second surface 10b. The composite passivation film 6 includes the first passivation film 14 having negative fixed charges and the protection film 15 that protects the first passivation film 14. The photoelectric conversion element 1 in the present embodiment further includes: the first electrode 19 disposed on the second surface 10b of the semiconductor substrate 10 and electrically connected to the n-type impurity diffusion layer 13; and the second electrode 18 disposed on the second surface 10b of the semiconductor substrate 10 and electrically connected to the p-type impurity diffusion layer 12.

In the photoelectric conversion element 1 in the present embodiment, the composite passivation film 6 is disposed on the second surface 10b of the semiconductor substrate 10, and the composite passivation film 6 includes the first passivation film 14 having negative fixed charges. The first passivation film 14 having negative fixed charges can prevent carriers generated in the photoelectric conversion element 1 when the photoelectric conversion element 1 is irradiated with light from recombining on a surface of the p-type impurity diffusion layer 12 and allows the second electrode 18 to collect the carriers efficiently. In the photoelectric conversion element 1 in the present embodiment, the carrier collection efficiency of the photoelectric conversion element provided can be improved.

In the photoelectric conversion element 1 in the present embodiment, the composite passivation film 6 is disposed on the second surface 10b of the semiconductor substrate 10. The composite passivation film 6 includes the protection film 15 that protects the first passivation film 14. The protection film 15 can mechanically protect the first passivation film 14 from, for example, an impact applied from the outside of the photoelectric conversion element 1. The protection film 15 can prevent the first passivation film 14 from being peeled off the semiconductor substrate 10 during a production process of the photoelectric conversion element 1 and after its production. Therefore, the first passivation film 14 obtained has high film quality. In the photoelectric conversion element 1 in the present embodiment, the carrier collection efficiency of the photoelectric conversion element provided can be improved.

In the photoelectric conversion element 1 in the present embodiment, the first electrode 19 and the second electrode 18 are disposed on the second surface 10b of the semiconductor substrate 10 that is opposite to the first surface 10a on which light is incident. Specifically, the photoelectric conversion element 1 in the present embodiment is a back-junction photoelectric conversion element. Light entering the photoelectric conversion element 1 is not reflected from the first electrode 19 and the second electrode 18. In the photoelectric conversion element 1 in the present embodiment, the efficiency of the photoelectric conversion element 1 provided in converting light energy into electric energy can be improved.

The photoelectric conversion element 1 in the present embodiment may further include the second passivation film 16 on the first surface 10a of the semiconductor substrate 10. When the photoelectric conversion element 1 in the present embodiment includes the second passivation film 16 on the first surface 10a of the semiconductor substrate 10, carriers generated in the photoelectric conversion element 2 when the photoelectric conversion element 2 is irradiated with light can be prevented from recombining on the first surface 10a of the semiconductor substrate 10. In the photoelectric conversion element 1 in the present embodiment, the carrier collection efficiency of the photoelectric conversion element provided can be further improved.

In the photoelectric conversion element 1 in the present embodiment, the second passivation film 16 may have a refractive index between the refractive index of the semiconductor substrate 10 and the refractive index of a material such as air present around the photoelectric conversion element 1. When the second passivation film 16 has a refractive index between the refractive index of the semiconductor substrate 10 and the refractive index of the material such as air present around the photoelectric conversion element 1, the second passivation film 16 can function as an antireflection coating. With the second passivation film 16 having the refractive index described above, reflection of the incident light from the first surface 10a of the semiconductor substrate 10 can be reduced, and a larger amount of light can enter the photoelectric conversion element 1. In the photoelectric conversion element 1 in the present embodiment, the efficiency of the photoelectric conversion element 1 in converting light energy into electric energy can be improved.

Figure 15:
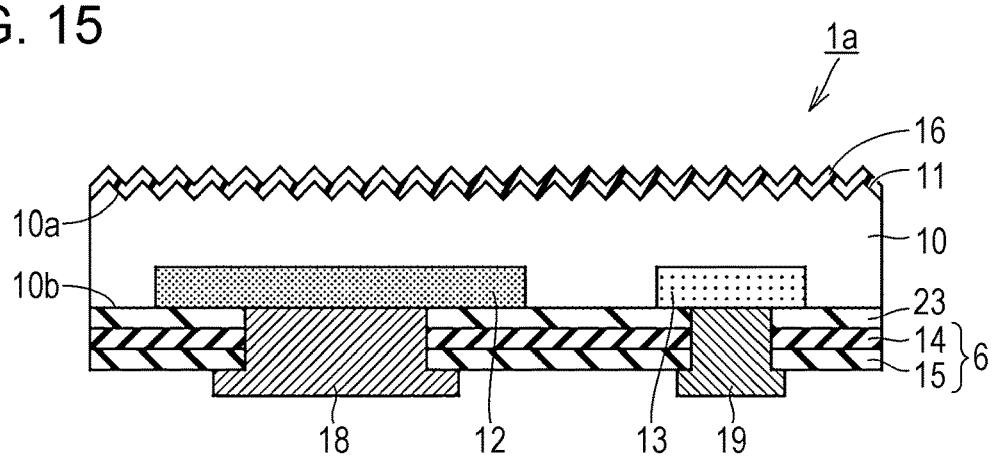
FIG. 15 is a schematic cross-sectional view of a photoelectric conversion element according to a modification of embodiment 1.

In a photoelectric conversion element 1a in a modification of the present embodiment, a second dielectric film 23 may be provided between the second surface 10b of the semiconductor substrate 10 and the first passivation film 14, as shown in FIG. 15. The second dielectric film may be formed by oxidizing the second surface 10b of the semiconductor substrate 10. One example of the second dielectric film 23 is silicon dioxide ($SiO_2$). It is preferable to select the material and thickness of the second dielectric film 23 such that the passivation effect of the first passivation film 14 is not impaired.

Embodiment 2

Figure 16:
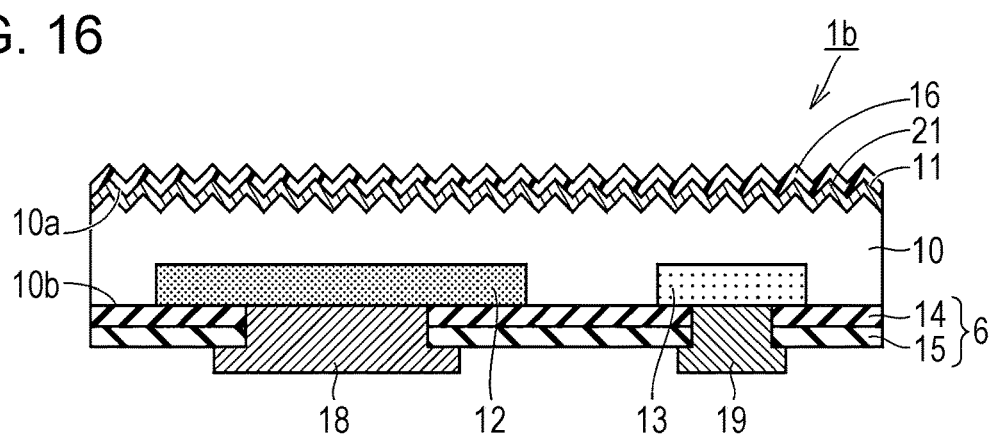
FIG. 16 is a schematic cross-sectional view of a photoelectric conversion element according to embodiment 2.

Referring to FIG. 16, a photoelectric conversion element 1b according to embodiment 2 will be described. The photoelectric conversion element 1a in the present embodiment has basically the same structure as the photoelectric conversion element 1 in embodiment 1 shown in FIGS. 1 and 2, and the same effects can be obtained. The photoelectric conversion element 1b differs from the photoelectric conversion element 1 mainly in the following respect.

In the present embodiment, a front surface field layer 21 is provided on the first surface 10a of the semiconductor substrate 10. The front surface field layer 21 may be an n-type impurity diffusion layer. The front surface field layer 21 may be formed, for example, by using vapor phase diffusion of $POCl_3$ to diffuse phosphorus, which is an n-type impurity, into the first surface 10a of the semiconductor substrate 10 at a temperature of 750° C. for 30 minutes. The front surface field layer 21 functions as a front surface field (FSF) barrier that prevents carriers generated in the semiconductor substrate 10 and diffusing toward the first surface 10a serving as the light-receiving surface from recombining near the first surface 10a. In the photoelectric conversion element 1b in the present embodiment, the carrier collection efficiency of the photoelectric conversion element provided can be further improved.

Embodiment 3

Figure 17:
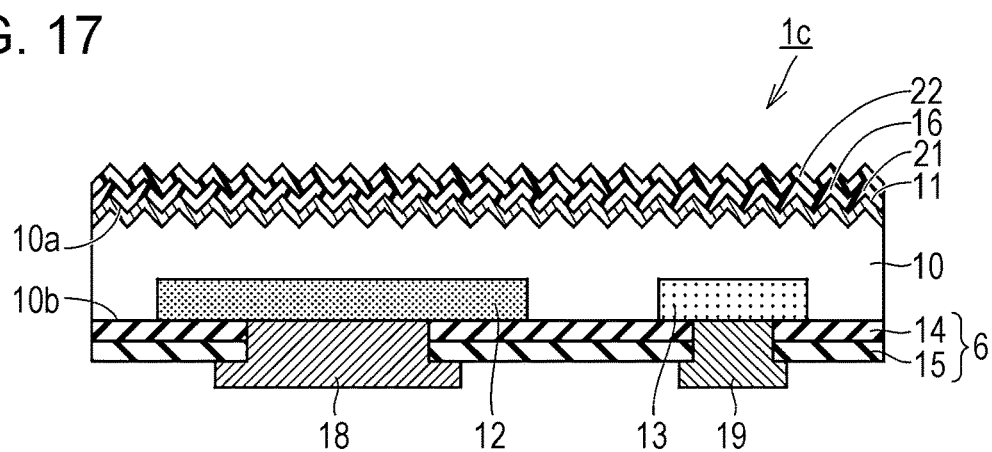
FIG. 17 is a schematic cross-sectional view of a photoelectric conversion element according to embodiment 3.

Referring to FIG. 17, a photoelectric conversion element 1c according to embodiment 3 will be described. The photoelectric conversion element 1b in the present embodiment has basically the same structure as the photoelectric conversion element 1b in embodiment 2 shown in FIG. 16 but differs from the photoelectric conversion element 1b mainly in the following respect.

The photoelectric conversion element 1c in the present embodiment further includes a first dielectric film 22 on the second passivation film 16. The second passivation film 16 has a refractive index that is larger than the refractive index of the first dielectric film 22 and smaller than the refractive index of the semiconductor substrate 10. The first dielectric film 22 may be formed of silicon nitride ($SiN_{x5}$), hydrogenated silicon nitride ($SiN_{x5}$:H), or silicon oxide ($SiO_{x5}$).

The effects of the photoelectric conversion element 1c in the present embodiment will be described. The photoelectric conversion element 1c in the present embodiment has the following effect in addition to the effects of the photoelectric conversion element 1b in embodiment 2.

The photoelectric conversion element 1c in the present embodiment may further include the dielectric film (the first dielectric film 22) on the second passivation film 16. The second passivation film 16 has a refractive index that is larger than the refractive index of the dielectric film (the first dielectric film 22) and smaller than the refractive index of the semiconductor substrate 10. Since the refractive index changes gently between the semiconductor substrate 10 and the outside of the photoelectric conversion element 1c, the reflectivity of light from the photoelectric conversion element 1c is further reduced, and a larger amount of light can enter the photoelectric conversion element 1c. In the photoelectric conversion element 1c in the present embodiment, the efficiency of the photoelectric conversion element provided in converting light energy into electric energy can be further improved.

Embodiment 4

Figure 18:
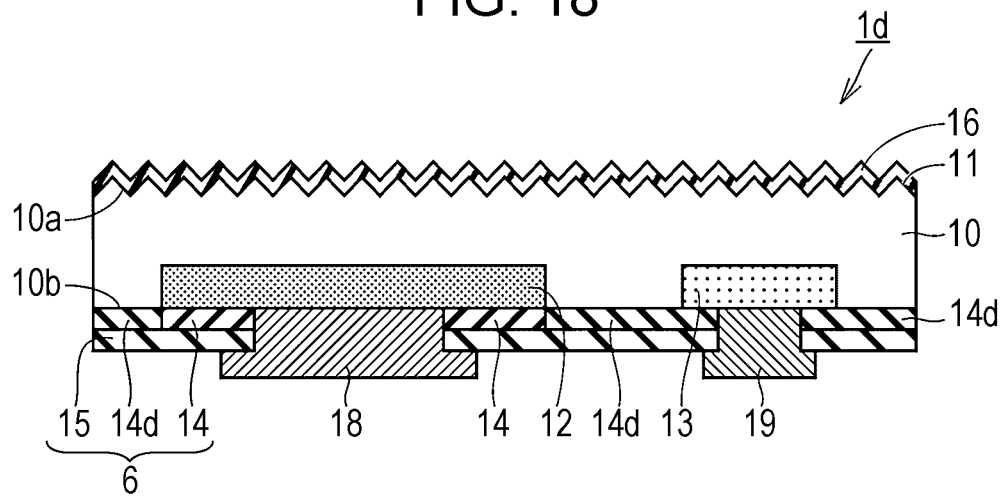
FIG. 18 is a schematic cross-sectional view of a photoelectric conversion element according to embodiment 4.

Referring to FIG. 18, a photoelectric conversion element 1d according to embodiment 4 will be described. The photoelectric conversion element 1d in the present embodiment has basically the same structure as the photoelectric conversion element 1 in embodiment 1 shown in FIGS. 1 and 2 but differs from the photoelectric conversion element 1 mainly in the following respect.

In the photoelectric conversion element 1d in the present embodiment, the composite passivation film 6 further includes a third passivation film 14d having no negative fixed charges. The first passivation film 14 is disposed on the p-type impurity diffusion layer 12 in the second surface 10b of the semiconductor substrate 10, and the third passivation film 14d is disposed on the n-type impurity diffusion layer 13 in the second surface 10b of the semiconductor substrate 10. When the semiconductor substrate 10 is n-type, the third passivation film 14d having no negative fixed charges may be disposed also on portions of the second surface 10b of the semiconductor substrate 10 in which portions the p-type impurity diffusion layer 12 and the n-type impurity diffusion layer 13 are not formed. One example of the third passivation film 14d having no negative fixed charges is silicon oxide ($SiO_2$).

The effects of the photoelectric conversion element 1d in the present embodiment will be described. The photoelectric conversion element 1d in the present embodiment has the following effects in addition to the effects of the photoelectric conversion element 1 in embodiment 1.

In the photoelectric conversion element 1d in the present embodiment, the first passivation film 14 having negative fixed charges is disposed on the p-type impurity diffusion layer 12 in the second surface 10b of the semiconductor substrate 10. Therefore, carriers (holes) generated in the semiconductor substrate 10 by light entering through the first surface 10a of the semiconductor substrate 10 are efficiently collected by the second electrode 18 electrically connected to the p-type impurity diffusion layer 12.

In the photoelectric conversion element 1d in the present embodiment, the third passivation film 14d having no negative fixed charges is disposed on the n-type impurity diffusion layer 13 in the second surface 10b of the semiconductor substrate 10. If a film having negative fixed charges is located on the n-type impurity diffusion layer 13, an inversion layer may be formed at the interface between the film having negative fixed charges and the n-type impurity diffusion layer 13, although this depends on the condition between the density of the negative fixed charges in the film having the negative fixed charges and the density of the n-type impurity in the n-type impurity diffusion layer 13. Therefore, the output power of the photoelectric conversion element may decrease. However, in the photoelectric conversion element 1d in the present embodiment, since the third passivation film 14d having no negative fixed charges is disposed on the n-type impurity diffusion layer 13 in the second surface 10b of the semiconductor substrate 10, the formation of an inversion layer at the interface between the third passivation film 14d and the n-type impurity diffusion layer 13 can be prevented. In the photoelectric conversion element 1d in the present embodiment, the output power of the photoelectric conversion element provided can be improved.

When the semiconductor substrate 10 is n-type, the third passivation film 14d having no negative fixed charges may be disposed also on the portions of the second surface 10b of the semiconductor substrate 10 in which portions the p-type impurity diffusion layer 12 and the n-type impurity diffusion layer 13 are not formed. In this case, the formation of an inversion layer at the interface between the third passivation film 14d and the semiconductor substrate 10 can also be prevented. In the photoelectric conversion element 1d in the present embodiment, the output power of the photoelectric conversion element provided can be further improved.

In the photoelectric conversion element 1d in the present embodiment, the third passivation film 14d having no negative fixed charges may be a dielectric film having positive fixed charges. When the third passivation film 14d has positive fixed charges, carriers (electrons) generated in the semiconductor substrate 10 by the light entering through the first surface 10a of the semiconductor substrate 10 can be efficiently collected by the first electrode 19 electrically connected to the n-type impurity diffusion layer 13. In the photoelectric conversion element 1d in the present embodiment, the carrier collection efficiency of the photoelectric conversion element provided can be further improved.

Embodiment 5

Figure 19:
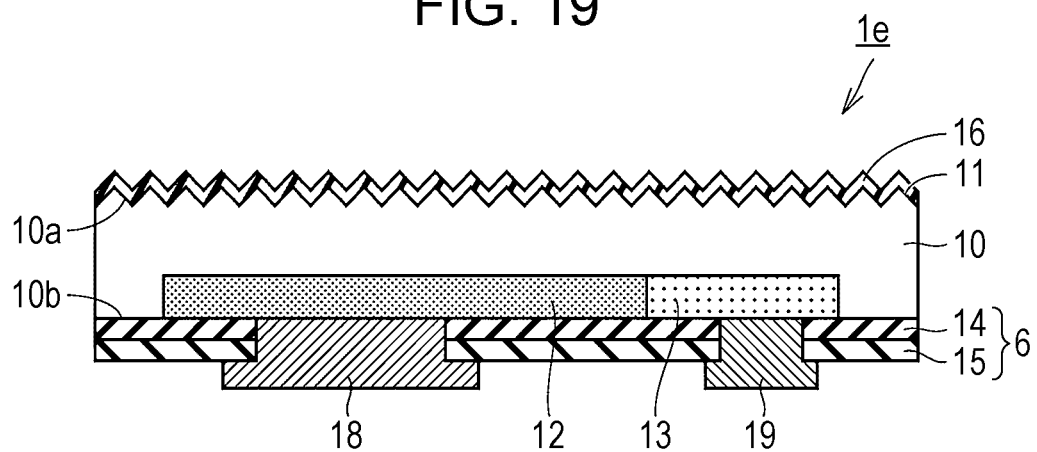
FIG. 19 is a schematic cross-sectional view of a photoelectric conversion element according to embodiment 5.

Referring to FIG. 19, a photoelectric conversion element 1e according to embodiment 5 will be described. The photoelectric conversion element 1e in the present embodiment has basically the same structure as the photoelectric conversion element 1 in embodiment 1 shown in FIGS. 1 and 2, and the same effects can be obtained. The photoelectric conversion element 1e differs from the photoelectric conversion element 1 mainly in the following respect.

In the photoelectric conversion element 1e in the present embodiment, the p-type impurity diffusion layer 12 is in contact with the n-type impurity diffusion layer 13. This can increase the area of the pn junction formed at the interface between the p-type impurity diffusion layer 12 or the n-type impurity diffusion layer 13 and a region of the semiconductor substrate 10 in which region the p-type impurity diffusion layer 12 and the n-type impurity diffusion layer 13 are not formed. For example, when the semiconductor substrate 10 is n-type, the area of the pn junction can be increased because of the increased area of the p-type impurity diffusion layer 12. When the semiconductor substrate 10 is p-type, the area of the pn junction can be increased because of the increased area of the n-type impurity diffusion layer 13. In the photoelectric conversion element 1e in the present embodiment, the carrier collection efficiency of the photoelectric conversion element provided can be further improved.

A plurality of embodiments selected from embodiments 1 to 5 may be appropriately combined to form modifications of embodiments 1 to 5. In one modification, the composite passivation film 6 including the third passivation film 14d having no negative fixed charges in embodiment 4 may be applied to one of the photoelectric conversion elements 1b, 1c, and 1e in embodiments 2, 3, and 5. In another modification, the p-type impurity diffusion layer 12 in any of the photoelectric conversion elements 1b, 1c, and 1d in embodiments 2 to 4 may be in contact with the n-type impurity diffusion layer 13, as in the photoelectric conversion element 1e in embodiment 5. In another modification, the front surface field layer 21 in the photoelectric conversion element 1c in embodiment 3 may be omitted.

Embodiment 6

Figure 20:
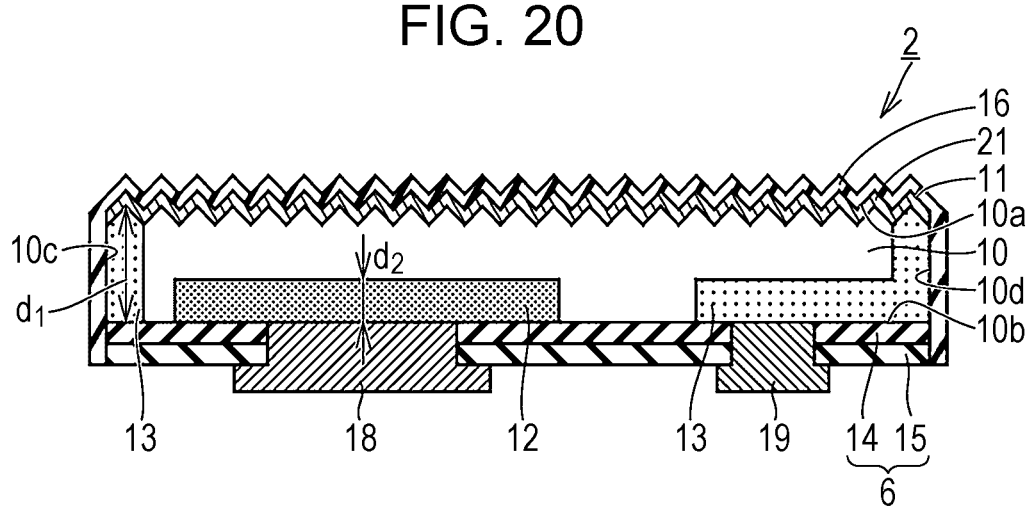
FIG. 20 is a schematic cross-sectional view of a photoelectric conversion element according to embodiment 6.

Referring to FIG. 20, a photoelectric conversion element 2 according to embodiment 6 will be described. The photoelectric conversion element 2 in the present embodiment has basically the same structure as the photoelectric conversion element 1b in embodiment 2 shown in FIG. 16 but differs from the photoelectric conversion element 1b mainly in the following respect.

In the photoelectric conversion element 2 in the present embodiment, the n-type impurity diffusion layer 13 included in the semiconductor substrate 10 is disposed also in at least part of side surfaces (e.g., the first side surface 10c and the second side surface 10d) of the semiconductor substrate 10. The side surfaces of the semiconductor substrate 10 that include the n-type impurity diffusion layer 13 may be side surfaces other than the first side surface 10c and the second side surface 10d. Let $d_1$ be the thickness, from the second surface 10b of the semiconductor substrate 10, of the n-type impurity diffusion layer 13 on the side surfaces (e.g., the first side surface 10c and the second side surface 10d) of the semiconductor substrate 10 that include the n-type impurity diffusion layer 13. Let $d_2$ be the thickness, from the second surface 10b of the semiconductor substrate 10, of the n-type impurity diffusion layer 13 in a region that covers the first electrode 19 electrically connected to the n-type impurity diffusion layer 13 in plan view from the second surface 10b side of the semiconductor substrate 10. Then the thickness $d_1$ may be larger than the thickness $d_2$.

The photoelectric conversion element 2 in the present embodiment may further include the second passivation film 16 on the first surface 10a of the semiconductor substrate 10. The second passivation film 16 may be disposed also on the side surfaces (the first side surface 10c and the second side surface 10d) of the semiconductor substrate 10 that include the n-type impurity diffusion layer 13.

Referring to FIGS. 21 to 28, a method for producing the photoelectric conversion element 2 in the present embodiment will be described. The method for producing the photoelectric conversion element 2 in the present embodiment includes basically the same steps as the method for producing the photoelectric conversion element 1 in embodiment 1 shown in FIGS. 3 to 14 but differs from the method in embodiment 1 mainly in the following respects.

The method for producing the photoelectric conversion element 2 in the present embodiment includes the steps shown in FIGS. 3 to 8. The textured structure 11 is formed on the first surface 10a of the semiconductor substrate 10 through the steps shown in FIGS. 3 and 4. The p-type impurity diffusion layer 12 is formed in part of the second surface 10b of the semiconductor substrate 10 through the steps shown in FIGS. 5 to 8. Then the first diffusion-preventing mask 5 is formed using, for example, an aqueous hydrogen fluoride solution.

Figure 21:
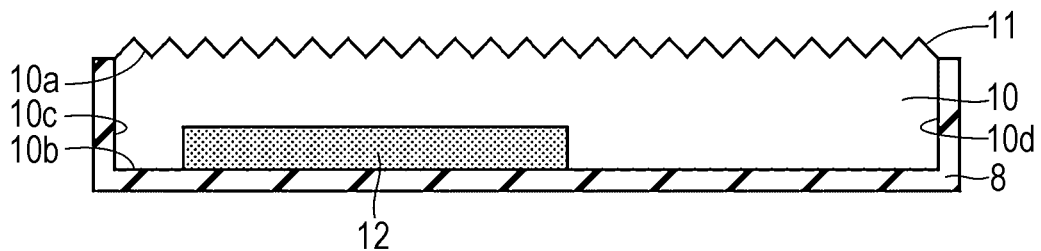
FIG. 21 is a schematic cross-sectional view showing a step in a method for producing the photoelectric conversion element according to embodiment 6.

Referring next to FIG. 21, a first mask 8 is formed on the second surface 10b of the semiconductor substrate 10 and its side surfaces (e.g., the first side surface 10c and the second side surface 10d). One example of the material of the first mask 8 is silicon dioxide ($SiO_2$). The first mask 8 may be formed by depositing the material of the first mask 8 on the second surface 10b of the semiconductor substrate 10 and its side surfaces by vapor deposition or by thermally oxidizing the second surface 10b, first side surface 10c, and second side surface 10d of the semiconductor substrate 10.

Figure 22:
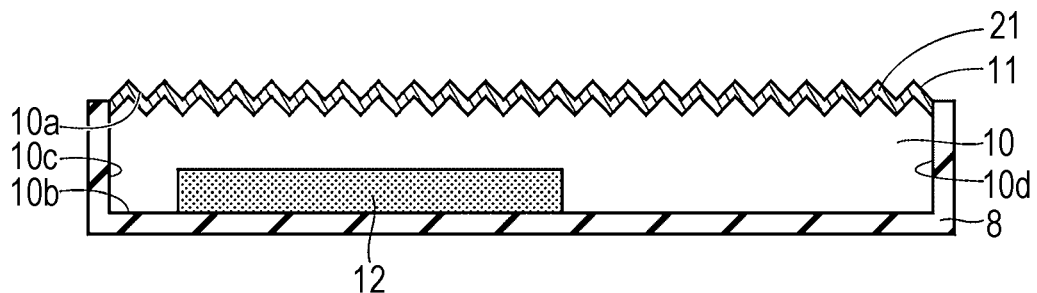
FIG. 22 is a schematic cross-sectional view showing the step next to the step shown in FIG. 21 in the method for producing the photoelectric conversion element according to embodiment 6.

Referring to FIG. 22, the front surface field layer 21 is formed on the first surface 10a of the semiconductor substrate 10 on which no first mask 8 is formed. The front surface field layer 21 may be an n-type impurity diffusion layer. The front surface field layer 21 may be formed, for example, by using vapor phase diffusion of $POCl_3$ to diffuse phosphorus, which is an n-type impurity, into the first surface 10a of the semiconductor substrate 10 at a temperature of 750° C. for 30 minutes. The front surface field layer 21 may be formed by depositing an n-type semiconductor layer on the first surface 10a of the semiconductor substrate 10 by vapor deposition. Then the first mask 8 is removed using, for example, an aqueous hydrogen fluoride solution.

Figure 23:
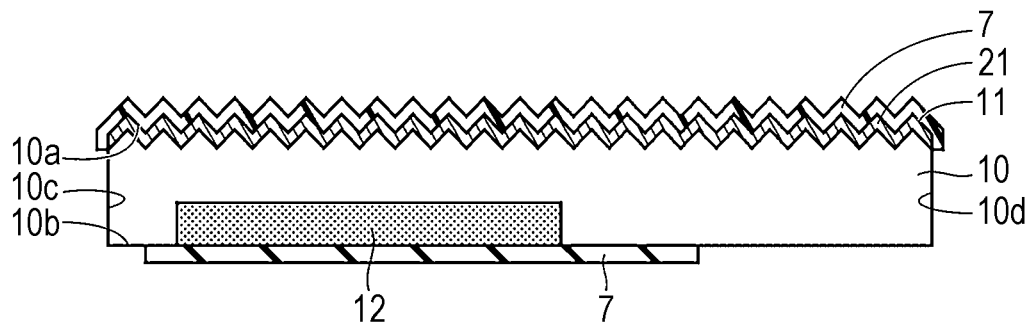
FIG. 23 is a schematic cross-sectional view showing the step next to the step shown in FIG. 22 in the method for producing the photoelectric conversion element according to embodiment 6.

Referring to FIG. 23, a second diffusion-preventing mask 7 is formed on the first surface 10a and second surface 10b of the semiconductor substrate 10. On the second surface 10b of the semiconductor substrate 10, the second diffusion-preventing mask 7 covers the p-type impurity diffusion layer 12. Regions of the second surface 10b of the semiconductor substrate 10 in which regions no p-type impurity diffusion layer 12 is formed and the side surfaces (e.g., the first side surface 10c and the second side surface 10d) of the semiconductor substrate are exposed from the second diffusion-preventing mask 7. The second diffusion-preventing mask 7 in the present embodiment may be formed using the same material and the same formation method as those of the second diffusion-preventing mask 7 in embodiment 1. For example, the second diffusion-preventing mask 7 in the present embodiment may be formed using a masking paste. Specifically, the masking paste is printed by, for example, a screen printing method on part of the second surface 10b of the semiconductor substrate 10 and on the first surface 10a. The semiconductor substrate 10 with the masking paste printed thereon is heated to, for example, a temperature of from 800° C. to 1,000° C. inclusive for from 10 minutes to 60 minutes inclusive to sinter the masking paste, and the second diffusion-preventing mask 7 is thereby formed. When the masking paste is used to form the second diffusion-preventing mask 7, the photoelectric conversion element 2 can be produced at lower cost than when photolithography is used to produce the second diffusion-preventing mask 7.

Figure 24:
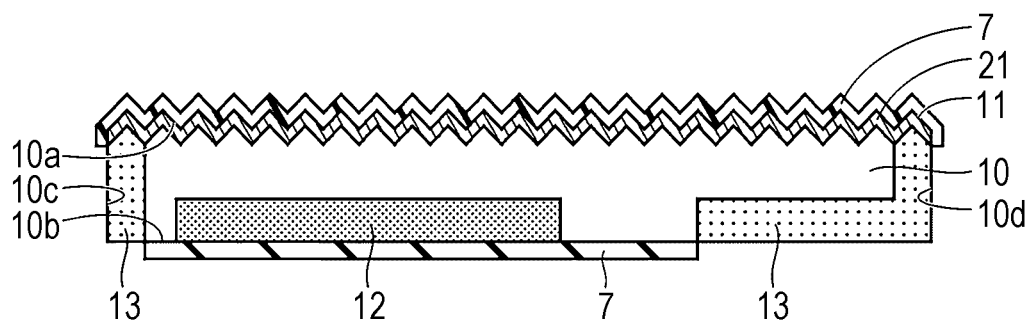
FIG. 24 is a schematic cross-sectional view showing the step next to the step shown in FIG. 23 in the method for producing the photoelectric conversion element according to embodiment 6.

Referring to FIG. 24, an n-type impurity is diffused into the second surface 10b, first side surface 10c, and second side surface 10d of the semiconductor substrate 10 that are exposed from the second diffusion-preventing mask 7, and the n-type impurity diffusion layer 13 is thereby formed. The n-type impurity diffusion layer 13 in the present embodiment may be formed using the same material and the same formation method as those of the n-type impurity diffusion layer 13 in embodiment 1. For example, the n-type impurity diffusion layer 13 may be formed by using vapor phase diffusion of $POCl_3$ to diffuse phosphorus, which is an n-type impurity, into the exposed regions of the second surface 10b and the first side surface 10c and second side surface 10d of the semiconductor substrate 10 that are exposed from the second diffusion-preventing mask 7 at a temperature of 800° C. for 30 minutes. The n-type impurity diffusion layer 13 may be formed by applying a solvent containing phosphorus to the regions of the second surface 10b of the semiconductor substrate 10 which regions are exposed from the second diffusion-preventing mask 7 and heating the semiconductor substrate 10 coated with the solvent containing phosphorus. Then the second diffusion-preventing mask 7 is removed using, for example, an aqueous hydrogen fluoride solution.

Figure 25:
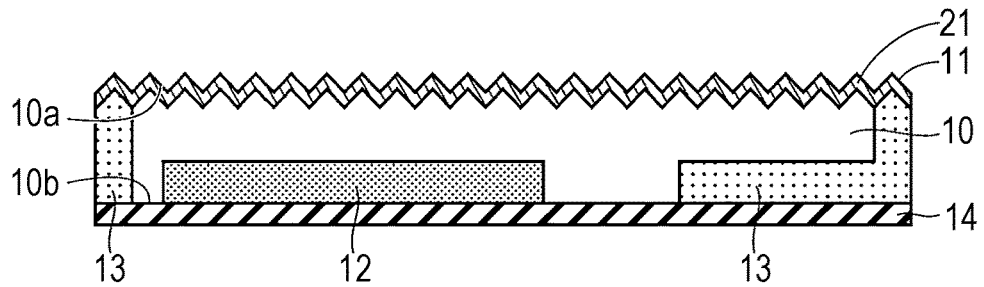
FIG. 25 is a schematic cross-sectional view showing the step next to the step shown in FIG. 24 in the method for producing the photoelectric conversion element according to embodiment 6.
Figure 26:
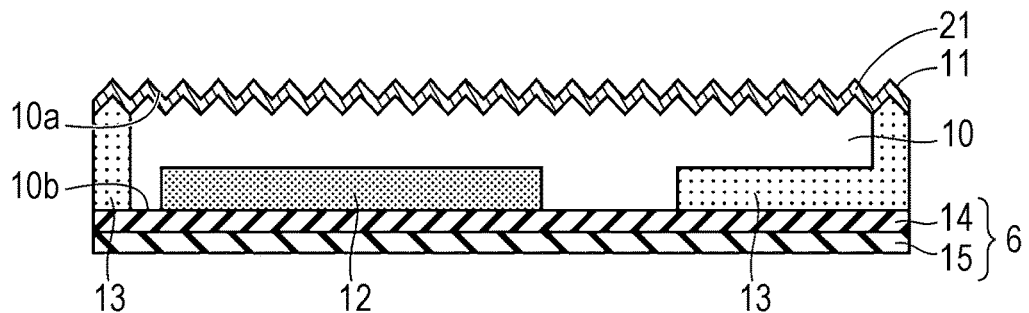
FIG. 26 is a schematic cross-sectional view showing the step next to the step shown in FIG. 25 in the method for producing the photoelectric conversion element according to embodiment 6.

Referring to FIGS. 25 and 26, the composite passivation film 6 is formed on the second surface 10b of the semiconductor substrate 10 including the p-type impurity diffusion layer 12 and the n-type impurity diffusion layer 13 formed by diffusion. Specifically, referring to FIG. 25, the first passivation film 14 is formed on the second surface 10b of the semiconductor substrate 10 including the p-type impurity diffusion layer 12 and the n-type impurity diffusion layer 13 formed by diffusion. The first passivation film 14 is formed of a material having negative fixed charges. The first passivation film 14 may be formed of aluminum oxide ($AlO_{x1}$) or hydrogenated aluminum oxide ($AlO_{x1}$:H). The first passivation film 14 may be formed using, for example, an atomic layer deposition (ALD) method, a sputtering method, or a plasma CVD method. Referring to FIG. 26, the protection film 15 is formed on the first passivation film 14. The protection film 15 protects the first passivation film 14. The protection film 15 may be formed of silicon oxide ($SiO_{x3}$), silicon nitride ($SiN_{x3}$), or hydrogenated silicon nitride ($SiN_{x3}$:H). The protection film 15 may be formed using, for example, a chemical vapor deposition (CVD) method or a sputtering method.

Figure 27:
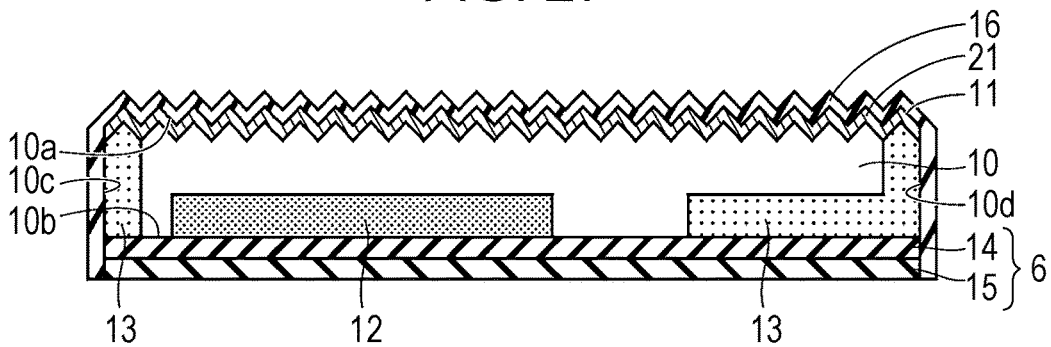
FIG. 27 is a schematic cross-sectional view showing the step next to the step shown in FIG. 26 in the method for producing the photoelectric conversion element according to embodiment 6.

Referring to FIG. 27, the second passivation film 16 may be formed on the first surface 10a of the semiconductor substrate 10 and its side surfaces (e.g., the first side surface 10c and the second side surface 10d). More specifically, the second passivation film 16 may be formed on the front surface field layer 21 formed on the first surface 10a of the semiconductor substrate 10 and on the side surfaces (e.g., the first side surface 10c and the second side surface 10d) of the semiconductor substrate 10. The second passivation film 16 may be formed using, for example, a chemical vapor deposition (CVD) method or a sputtering method. The second passivation film 16 has a refractive index between the refractive index of the semiconductor substrate 10 and the refractive index of a material such as air present around the photoelectric conversion element 2 and may function as an antireflection coating.

Figure 28:
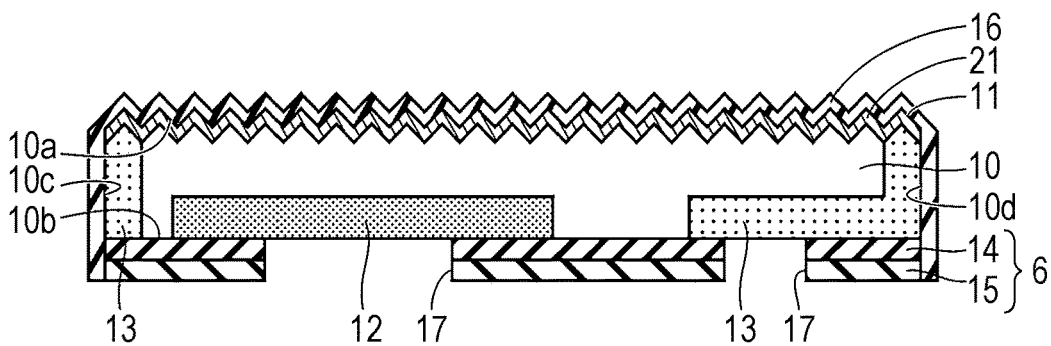
FIG. 28 is a schematic cross-sectional view showing the step next to the step shown in FIG. 27 in the method for producing the photoelectric conversion element according to embodiment 6.

Referring to FIG. 28, through holes 17 are formed in the composite passivation film 6. Then the first electrode 19 and the second electrode 18 are formed on the composite passivation film 6. The second electrode 18 is formed in one of the through holes 17 and electrically connected to the p-type impurity diffusion layer 12. The first electrode 19 is formed in the other through hole 17 and electrically connected to the n-type impurity diffusion layer 13. The photoelectric conversion element 2 in the present embodiment that is shown in FIG. 20 can thereby be produced.

The effects of the photoelectric conversion element 2 in the present embodiment will be described. The photoelectric conversion element 2 in the present embodiment has the following effects in addition to the effects of the photoelectric conversion element 1b in embodiment 2.

In the photoelectric conversion element 2 in the present embodiment, the n-type impurity diffusion layer 13 included in the semiconductor substrate 10 is disposed also in at least part of the side surfaces (e.g., the first side surface 10c and the second side surface 10d) of the semiconductor substrate 10. Therefore, in the photoelectric conversion element 2 in the present embodiment, the carrier collection efficiency of the photoelectric conversion element provided can be further improved.

For example, when the semiconductor substrate 10 is n-type, the n-type impurity diffusion layer 13 disposed in at least part of the side surfaces (e.g., the first side surface 10c and the second side surface 10d) of the semiconductor substrate 10 may function as a side surface field layer. By the field effect of the n-type impurity diffusion layer 13 disposed in at least part of the side surfaces (e.g., the first side surface 10c and the second side surface 10d) of the semiconductor substrate 10, carriers generated in the photoelectric conversion element 2 by the light entering the photoelectric conversion element 2 can be prevented from recombining on the side surfaces (e.g., the first side surface 10c and the second side surface 10d) of the semiconductor substrate 10. Therefore, the carriers generated in the semiconductor substrate 10 by the light entering the photoelectric conversion element 2 can be efficiently collected. For example, when the semiconductor substrate 10 is p-type, the pn junction is formed also near the side surfaces (e.g., the first side surface 10c and the second side surface 10d) of the semiconductor substrate 10, and the area of the pn junction increases. This allows the carriers generated near the side surfaces (e.g., the first side surface 10c and the second side surface 10d) of the semiconductor substrate 10 by the light entering the photoelectric conversion element 2 to be collected efficiently.

Let $d_1$ be the thickness, from the second surface 10b of the semiconductor substrate 10, of the n-type impurity diffusion layer 13 on the side surfaces (e.g., the first side surface 10c and the second side surface 10d) of the semiconductor substrate 10 that include the n-type impurity diffusion layer 13. Let $d_2$ be the thickness, from the second surface 10b of the semiconductor substrate 10, of the n-type impurity diffusion layer 13 in a region that covers the first electrode 19 in plan view from the second surface 10b side of the semiconductor substrate 10. In the photoelectric conversion element 2 in the present embodiment, the thickness $d_1$ may be larger than the thickness $d_2$. The regions in which the n-type impurity diffusion layer 13 is formed can be extended in the thickness direction of the semiconductor substrate 10 (the direction in which the first surface 10a faces the second surface 10b). Therefore, carriers generated near the first surface 10a of the semiconductor substrate 10 can be efficiently collected. In the photoelectric conversion element 2 in the present embodiment, the carrier collection efficiency of the photoelectric conversion element provided can be further improved.

The photoelectric conversion element 2 in the present embodiment may further include the second passivation film 16 disposed on the first surface 10a of the semiconductor substrate 10. When the second passivation film 16 is disposed on the first surface 10a of the semiconductor substrate 10, carriers generated in the photoelectric conversion element 2 when the photoelectric conversion element 2 is irradiated with light can be prevented from recombining on the first surface 10a of the semiconductor substrate 10. In the photoelectric conversion element 2 in the present embodiment, the carrier collection efficiency of the photoelectric conversion element provided can be further improved.

In the photoelectric conversion element 2 in the present embodiment, the second passivation film 16 may be disposed also on the side surfaces (e.g., the first side surface 10c and the second side surface 10d) of the semiconductor substrate 10 that include the n-type impurity diffusion layer 13. In the photoelectric conversion element 2 in the present embodiment, when the second passivation film 16 is disposed also on the side surfaces (e.g., the first side surface 10c and the second side surface 10d) of the semiconductor substrate 10 that include the n-type impurity diffusion layer 13, carriers generated in the photoelectric conversion element 2 when the photoelectric conversion element 2 is irradiated with light can be prevented from recombining on the side surfaces (e.g., the first side surface 10c and the second side surface 10d) of the semiconductor substrate 10. In the photoelectric conversion element 2 in the present embodiment, the carrier collection efficiency of the photoelectric conversion element provided can be further improved.

Embodiment 7

Figure 29:
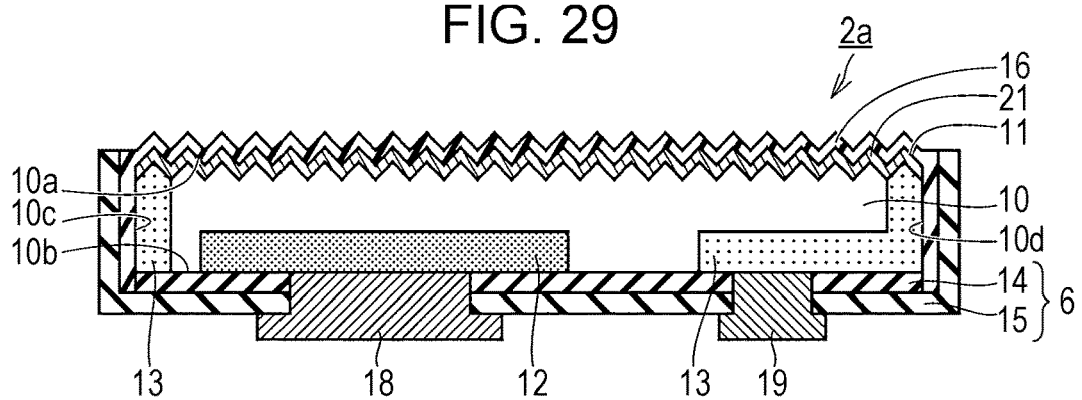
FIG. 29 is a schematic cross-sectional view of a photoelectric conversion element according to embodiment 7.

Referring to FIG. 29, a photoelectric conversion element 2a according to embodiment 7 will be described. The photoelectric conversion element 2a in the present embodiment has basically the same structure as the photoelectric conversion element 2 in embodiment 6 shown in FIG. 20, and the same effects can be obtained. The photoelectric conversion element 2a differs from the photoelectric conversion element 2 mainly in the following respect.

In the photoelectric conversion element 2a in the present embodiment, the protection film 15 is disposed also on the side surfaces (e.g., the first side surface 10c and the second side surface 10d) of the semiconductor substrate 10 that include the n-type impurity diffusion layer 13. The second passivation film 16 is located between the protection film 15 and each of the side surfaces (e.g., the first side surface 10c and the second side surface 10d) of the semiconductor substrate 10 that include the n-type impurity diffusion layer 13. On the side surfaces (the first side surface 10c and the second side surface 10d) of the semiconductor substrate 10 that include the n-type impurity diffusion layer 13, the protection film 15 covers the second passivation film 16.

The protection film 15 can mechanically protect the first passivation film 14 and the second passivation film 16 from, for example, an impact applied from the outside of the photoelectric conversion element 2a. The protection film 15 can prevent the first passivation film 14 and the second passivation film 16 from being peeled off the semiconductor substrate 10 during the production process of the photoelectric conversion element 2a and after its production. Therefore, the first passivation film 14 and second passivation film 16 obtained have high film quality. In the photoelectric conversion element 2a in the present embodiment, the carrier collection efficiency of the photoelectric conversion element provided can be further improved.

Embodiment 8

Figure 30:
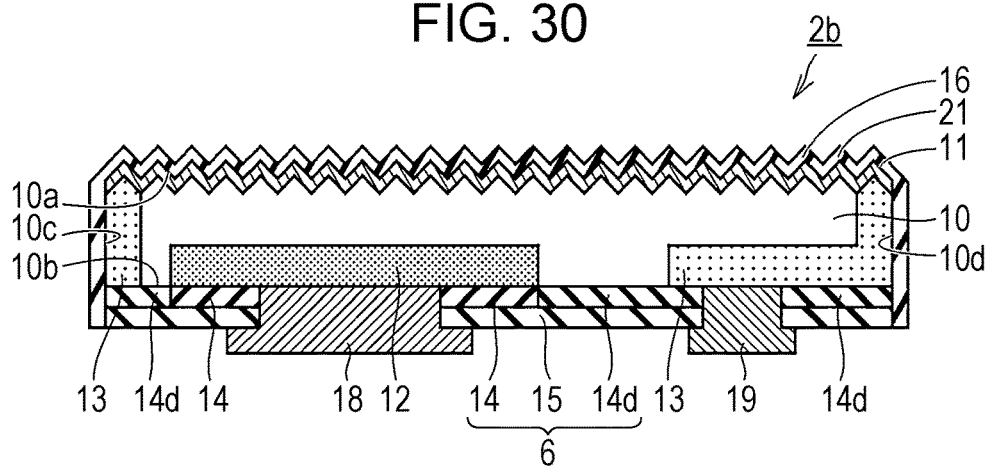
FIG. 30 is a schematic cross-sectional view of a photoelectric conversion element according to embodiment 8.

Referring to FIG. 30, a photoelectric conversion element 2b according to embodiment 8 will be described. The photoelectric conversion element 2b in the present embodiment has basically the same structure as the photoelectric conversion element 2 in embodiment 6 shown in FIG. 20 but differs from the photoelectric conversion element 2 mainly in the following respect.

In the photoelectric conversion element 2b in the present embodiment, the composite passivation film 6 further includes a third passivation film 14d having no negative fixed charges. The first passivation film 14 is disposed on the p-type impurity diffusion layer 12 in the second surface 10b of the semiconductor substrate 10, and the third passivation film 14d is disposed on the n-type impurity diffusion layer 13 in the second surface 10b of the semiconductor substrate 10. When the semiconductor substrate 10 is n-type, the third passivation film 14d having no negative fixed charges may be disposed also on portions of the second surface 10b of the semiconductor substrate 10 in which portions the p-type impurity diffusion layer 12 and the n-type impurity diffusion layer 13 are not formed.

The effects of the photoelectric conversion element 2b in the present embodiment will be described. The photoelectric conversion element 2b in the present embodiment has the following effects in addition to the effects of the photoelectric conversion element 2 in embodiment 6.

In the photoelectric conversion element 2b in the present embodiment, the first passivation film 14 having negative fixed charges is disposed on the p-type impurity diffusion layer 12 in the second surface 10b of the semiconductor substrate 10. Therefore, carriers (holes) generated in the semiconductor substrate 10 by the light entering through the first surface 10a of the semiconductor substrate 10 are efficiently collected by the second electrode 18 electrically connected to the p-type impurity diffusion layer 12.

In the photoelectric conversion element 2b in the present embodiment, the third passivation film 14d having no negative fixed charges is disposed on the n-type impurity diffusion layer 13 in the second surface 10b of the semiconductor substrate 10. If a film having negative fixed charges is located on the n-type impurity diffusion layer 13, an inversion layer may be formed at the interface between the film having negative fixed charges and the n-type impurity diffusion layer 13, although this depends on the condition between the density of the negative fixed charges in the film having the negative fixed charges and the density of the n-type impurity in the n-type impurity diffusion layer 13. Therefore, the output power of the photoelectric conversion element may decrease. However, in the photoelectric conversion element 2b in the present embodiment, since the third passivation film 14d having no negative fixed charges is disposed on the n-type impurity diffusion layer 13 in the second surface 10b of the semiconductor substrate 10, the formation of an inversion layer at the interface between the third passivation film 14d and the n-type impurity diffusion layer 13 can be prevented. In the photoelectric conversion element 2b in the present embodiment, the output power of the photoelectric conversion element provided can be improved. When the semiconductor substrate 10 is n-type, the third passivation film 14d having no negative fixed charges may be disposed also on the portions of the second surface 10b of the semiconductor substrate 10 in which portions the p-type impurity diffusion layer 12 and the n-type impurity diffusion layer 13 are not formed. In this case, the formation of an inversion layer at the interface between the third passivation film 14d and the semiconductor substrate 10 can also be prevented. In the photoelectric conversion element 2b in the present embodiment, the output power of the photoelectric conversion element provided can be further improved.

In the photoelectric conversion element 2b in the present embodiment, the third passivation film 14d having no negative fixed charges may be a dielectric film having positive fixed charges. When the third passivation film 14d has positive fixed charges, carriers (electrons) generated in the semiconductor substrate 10 by the light entering through the first surface 10a of the semiconductor substrate 10 are efficiently collected by the first electrode 19 electrically connected to the n-type impurity diffusion layer 13. In the photoelectric conversion element 2b in the present embodiment, the carrier collection efficiency of the photoelectric conversion element provided can be further improved.

A plurality of embodiments selected from embodiments 6 to 8 may be appropriately combined to form modifications of embodiments 6 to 8. For example, the composite passivation film 6 having the third passivation film 14d having no negative fixed charges in embodiment 8 may be applied to the photoelectric conversion element 2a in embodiment 7. In the photoelectric conversion elements 2, 2a, and 2b in embodiments 6 to 8, the front surface field layer 21 may be omitted. In the photoelectric conversion elements 2 and 2a in embodiments 6 and 7, a second dielectric film 23 may be disposed between the first passivation film 14 and the second surface 10b of the semiconductor substrate 10, as shown in FIG. 15. In the photoelectric conversion element 2b in embodiment 8, the second dielectric film 23 may be disposed between the first passivation film 14 and the second surface 10b of the semiconductor substrate 10 and between the third passivation film 14d and the second surface 10b of the semiconductor substrate 10, as shown in FIG. 15. In the photoelectric conversion elements 2, 2a, and 2b in embodiments 6 to 8, a first dielectric film 22 may be disposed on the second passivation film 16, as shown in FIG. 17. In the photoelectric conversion elements 2, 2a, and 2b in embodiments 6 to 8, the p-type impurity diffusion layer 12 may be in contact with the n-type impurity diffusion layer 13, as shown in FIG. 19. In the photoelectric conversion elements 2, 2a, and 2b in embodiments 6 to 8, the n-type impurity diffusion layer 13 may be formed in at least one of the first side surface 10c and second side surface 10d of the semiconductor substrate 10. When the n-type impurity diffusion layer 13 is formed in one of the first side surface 10c and second side surface 10d of the semiconductor substrate 10, the second passivation film 16 may not be formed on the other one of the first side surface 10c and the second side surface 10d in which no n-type impurity diffusion layer 13 is formed.

Embodiment 9

Figure 31:
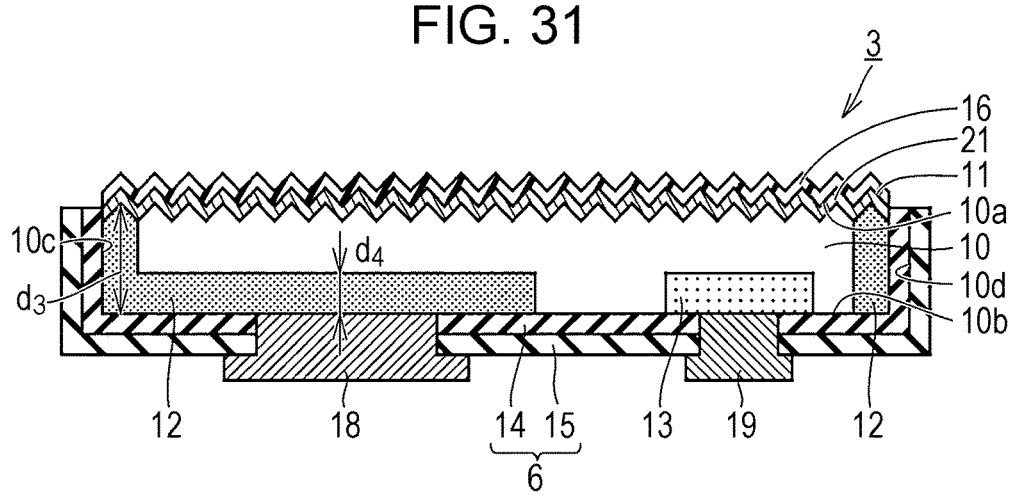
FIG. 31 is a schematic cross-sectional view of a photoelectric conversion element according to embodiment 9.

Referring to FIG. 31, a photoelectric conversion element 3 according to embodiment 9 will be described. The photoelectric conversion element 3 in the present embodiment has basically the same structure as the photoelectric conversion element 1b in embodiment 2 shown in FIG. 16 but differs from the photoelectric conversion element 1b mainly in the following respect.

In the photoelectric conversion element 3 in the present embodiment, the p-type impurity diffusion layer 12 included in the semiconductor substrate 10 is disposed also in at least part of the side surfaces (e.g., the first side surface 10c and the second side surface 10d) of the semiconductor substrate 10. The side surfaces of the semiconductor substrate 10 that include the p-type impurity diffusion layer 12 may be side surfaces other than the first side surface 10c and the second side surface 10d. Let $d_3$ be the thickness, from the second surface 10b of the semiconductor substrate 10, of the p-type impurity diffusion layer 12 on the side surfaces (e.g., the first side surface 10c and the second side surface 10d) of the semiconductor substrate 10 that include the p-type impurity diffusion layer 12. Let $d_4$ be the thickness, from the second surface 10b of the semiconductor substrate 10, of the p-type impurity diffusion layer 12 in a region that covers the second electrode 18 in plan view from the second surface 10b side of the semiconductor substrate 10. Then the thickness $d_3$ may be larger than the thickness $d_4$.

In the photoelectric conversion element 3 in the present embodiment, the first passivation film 14 and the protection film 15 are disposed also on the side surfaces (e.g., the first side surface 10c and the second side surface 10d) of the semiconductor substrate 10 that include the p-type impurity diffusion layer 12. The first passivation film 14 is located between the protection film 15 and each of the side surfaces (e.g., the first side surface 10c and the second side surface 10d) of the semiconductor substrate 10 that include the p-type impurity diffusion layer 12. On the side surfaces (e.g., the first side surface 10c and the second side surface 10d) of the semiconductor substrate 10 that include the p-type impurity diffusion layer 12, the protection film 15 covers the first passivation film 14.

Referring to FIGS. 32 to 43, a method for producing the photoelectric conversion element 3 in the present embodiment will be described. The method for producing the photoelectric conversion element 3 in the present embodiment includes basically the same steps as the method for producing the photoelectric conversion element 1 in embodiment 1 shown in FIGS. 3 to 14 but differs from the method in embodiment 1 mainly in the following respects.

The method for producing the photoelectric conversion element 3 in the present embodiment includes the steps shown in FIGS. 3 and 4. The textured structure 11 is formed on the first surface 10a of the semiconductor substrate 10 through the steps shown in FIGS. 3 and 4. Then the etching protection film 4 on the second surface 10b, first side surface 10c, and second side surface 10d of the semiconductor substrate 10 is removed using, for example, an aqueous hydrogen fluoride solution.

Figure 32:
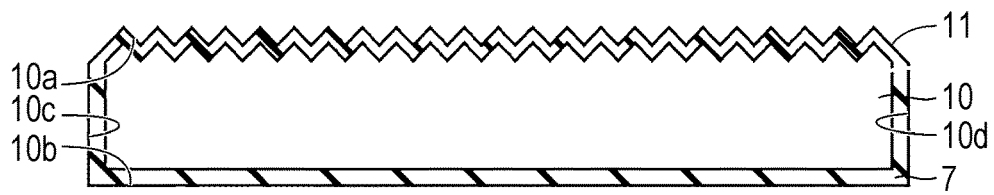
FIG. 32 is a schematic cross-sectional view showing a step in a method for producing the photoelectric conversion element according to embodiment 9.

Referring next to FIG. 32, a second diffusion-preventing mask 7 is formed on the first surface 10a, second surface 10b, and side surfaces (e.g., the first side surface 10c and the second side surface 10d) of the semiconductor substrate 10. The second diffusion-preventing mask 7 is a mask for preventing an n-type impurity from diffusing into the semiconductor substrate 10. One example of the second diffusion-preventing mask 7 is a silicon oxide film. The second diffusion-preventing mask 7 may be formed by thermally oxidizing the first surface 10a, second surface 10b, first side surface 10c, and second side surface 10d of the semiconductor substrate 10 using, for example, a steam oxidation method. No particular limitation is imposed on the thickness of the second diffusion-preventing mask 7, but the thickness may be from 100 nm to 300 nm inclusive. The second diffusion-preventing mask 7 used may be, for example, a silicon nitride film or a stack of a silicon oxide film and a silicon nitride film. The silicon nitride film may be formed by, for example, a plasma CVD method or an atmospheric pressure CVD method. No particular limitation is imposed on the thickness of the silicon nitride film. The thickness may be, for example, from 40 nm to 80 nm inclusive.

Figure 33:
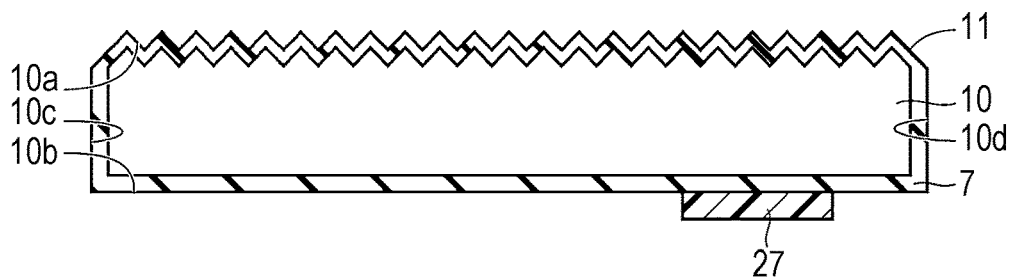
FIG. 33 is a schematic cross-sectional view showing the step next to the step shown in FIG. 32 in the method for producing the photoelectric conversion element according to embodiment 9.

Referring to FIG. 33, a second etching paste 27 containing a component capable of etching the second diffusion-preventing mask 7 is printed on part of the second diffusion-preventing mask 7 on the second surface 10b of the semiconductor substrate 10. The second etching paste 27 is formed by, for example, a screen printing method on a portion of the second diffusion-preventing mask 7 which portion corresponds to a region in which the n-type impurity diffusion layer 13 is to be formed. One example of the component that is contained in the second etching paste 27 and etches the second diffusion-preventing mask 7 is phosphoric acid. The second etching paste 27 further contains water, an organic solvent, and a thickener.

Figure 34:
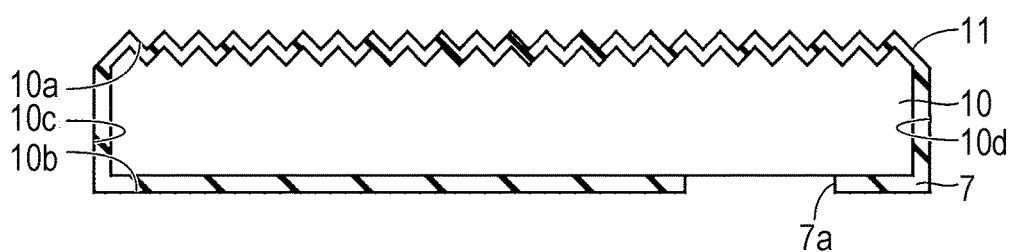
FIG. 34 is a schematic cross-sectional view showing the step next to the step shown in FIG. 33 in the method for producing the photoelectric conversion element according to embodiment 9.

Referring to FIG. 34, the semiconductor substrate 10 with the second etching paste 27 formed thereon is subjected to first heat treatment to etch and remove the portion of the second diffusion-preventing mask 7 which portion is on the second surface 10b of the semiconductor substrate 10 and on which portion the second etching paste 27 has been formed. After the first heat treatment, the second surface 10b of the semiconductor substrate 10 is washed with water, and the second etching paste 27 is thereby removed. As shown in FIG. 34, part of the second diffusion-preventing mask 7 is removed, and an opening 7a is formed in part of the second diffusion-preventing mask 7. In the opening 7a of the second diffusion-preventing mask 7, part of the second surface 10b of the semiconductor substrate 10 is exposed from the second diffusion-preventing mask 7.

Figure 35:
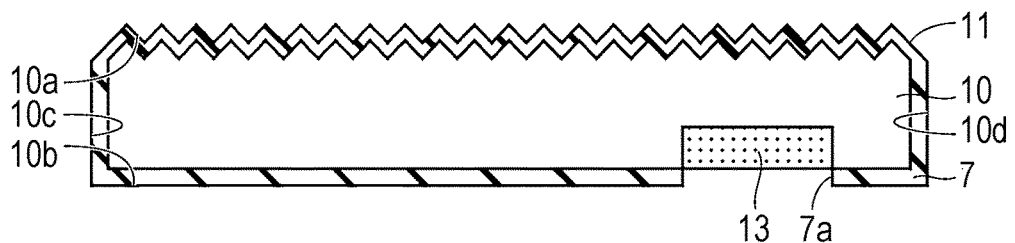
FIG. 35 is a schematic cross-sectional view showing the step next to the step shown in FIG. 34 in the method for producing the photoelectric conversion element according to embodiment 9.

Referring to FIG. 35, an n-type impurity is diffused into the portion of the second surface 10b of the semiconductor substrate 10 which portion is exposed from the second diffusion-preventing mask 7, and the n-type impurity diffusion layer 13 is thereby formed. For example, the n-type impurity diffusion layer 13 may be formed by using vapor phase diffusion of $POCl_3$ to diffuse phosphorus, which is an n-type impurity, into the portion of the second surface 10b of the semiconductor substrate 10 which portion is exposed from the second diffusion-preventing mask 7 at a temperature of 800° C. for 30 minutes. The n-type impurity diffusion layer 13 may be formed by applying a solvent containing phosphorus to the portion of the second surface 10b of the semiconductor substrate 10 which portion is exposed from the second diffusion-preventing mask 7 and then heating the semiconductor substrate 10 coated with the solvent containing phosphorus. Then the second diffusion-preventing mask 7 is removed using, for example, an aqueous hydrogen fluoride solution.

Figure 36:
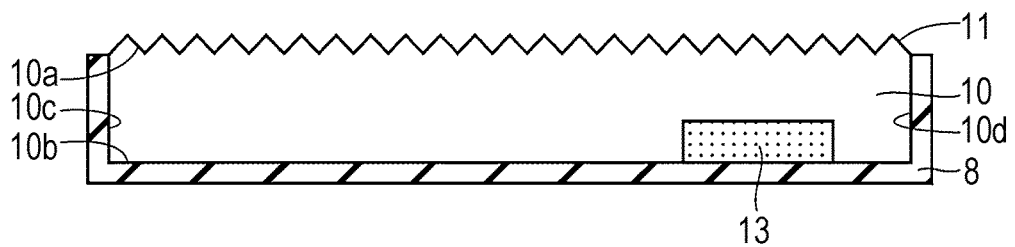
FIG. 36 is a schematic cross-sectional view showing the step next to the step shown in FIG. 35 in the method for producing the photoelectric conversion element according to embodiment 9.

Referring to FIG. 36, a first mask 8 is formed on the second surface 10b and side surfaces (e.g., the first side surface 10c and the second side surface 10d) of the semiconductor substrate 10. One example of the material of the first mask 8 is silicon dioxide ($SiO_2$). The first mask 8 may be formed by depositing the material of the first mask 8 on the second surface 10b, first side surface 10c, and second side surface 10d of the semiconductor substrate 10 by vapor deposition or by thermally oxidizing the second surface 10b, first side surface 10c, and second side surface 10d of the semiconductor substrate 10.

Figure 37:
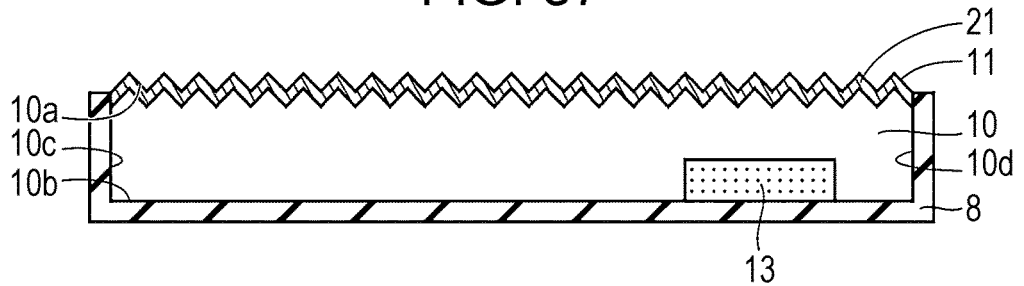
FIG. 37 is a schematic cross-sectional view showing the step next to the step shown in FIG. 36 in the method for producing the photoelectric conversion element according to embodiment 9.

Referring to FIG. 37, the front surface field layer 21 is formed on the first surface 10a of the semiconductor substrate 10 on which no first mask 8 is formed. The front surface field layer 21 may be an n-type impurity diffusion layer. The front surface field layer 21 may be formed, for example, by using vapor phase diffusion of $POCl_3$ to diffuse phosphorus, which is an n-type impurity, into the first surface 10a of the semiconductor substrate 10 at a temperature of 750° C. for 30 minutes. The front surface field layer 21 may be formed by depositing an n-type semiconductor layer on the first surface 10a of the semiconductor substrate 10 by vapor deposition. Then the first mask 8 is removed using, for example, an aqueous hydrogen fluoride solution.

Figure 38:
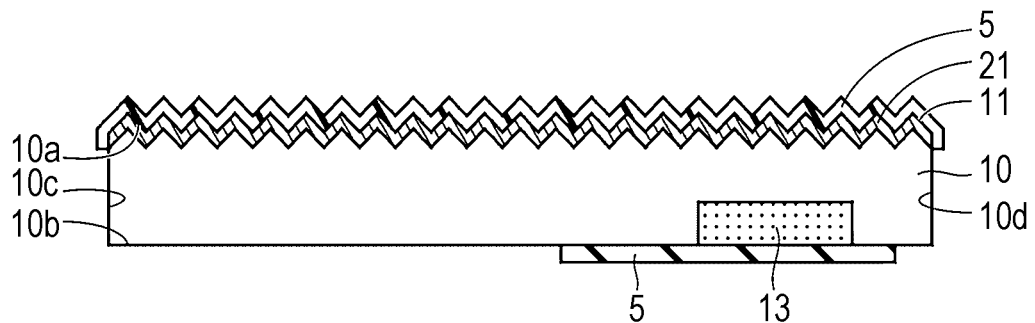
FIG. 38 is a schematic cross-sectional view showing the step next to the step shown in FIG. 37 in the method for producing the photoelectric conversion element according to embodiment 9.

Referring to FIG. 38, a first diffusion-preventing mask 5 is formed on the first surface 10a and second surface 10b of the semiconductor substrate 10. The first diffusion-preventing mask 5 is a mask for preventing a p-type impurity from diffusing into the semiconductor substrate 10. The first diffusion-preventing mask 5 covers the front surface field layer 21. On the second surface 10b of the semiconductor substrate 10, the first diffusion-preventing mask 5 covers the n-type impurity diffusion layer 13. Regions of the second surface 10b of the semiconductor substrate 10 in which regions no n-type impurity diffusion layer 13 is formed and the side surfaces (e.g., the first side surface 10c and the second side surface 10d) of the semiconductor substrate 10 are exposed from the first diffusion-preventing mask 5. The first diffusion-preventing mask 5 in the present embodiment may be formed using a masking paste. Specifically, the masking paste is printed by, for example, a screen printing method on the front surface field layer 21, on part of the second surface 10b of the semiconductor substrate 10, and on the first surface 10a. The semiconductor substrate 10 with the masking paste printed thereon is heated to, for example, a temperature of from 800° C. to 1,000° C. inclusive for from 10 minutes to 60 minutes inclusive to sinter the masking paste, and the first diffusion-preventing mask 5 is thereby formed. When the masking paste is used to form the first diffusion-preventing mask 5, the photoelectric conversion element 3 can be produced at lower cost than when photolithography is used to produce the first diffusion-preventing mask 5.

Figure 39:
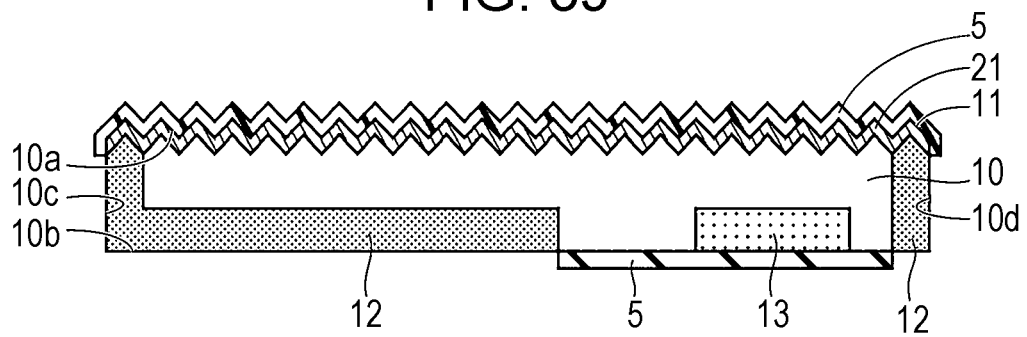
FIG. 39 is a schematic cross-sectional view showing the step next to the step shown in FIG. 38 in the method for producing the photoelectric conversion element according to embodiment 9.

Referring to FIG. 39, a p-type impurity is diffused into the second surface 10b and side surfaces (e.g., the first side surface 10c and the second side surface 10d) of the semiconductor substrate 10 that are exposed from the first diffusion-preventing mask 5, and the p-type impurity diffusion layer 12 is thereby formed. The p-type impurity diffusion layer 12 in the present embodiment may be formed using the same material and the same formation method as those of the p-type impurity diffusion layer 12 in embodiment 1. For example, the p-type impurity diffusion layer 12 may be formed by using vapor phase diffusion of $BBr_3$ to diffuse boron, which is a p-type impurity, into the second surface 10b and side surfaces (e.g., the first side surface 10c and the second side surface 10d) of the semiconductor substrate 10 that are exposed from the first diffusion-preventing mask 5 at a temperature of, for example, 950° C. for 30 minutes. The p-type impurity diffusion layer 12 may be formed by applying a solvent containing boron to the second surface 10b and side surfaces (e.g., the first side surface 10c and the second side surface 10d) of the semiconductor substrate 10 that are exposed from the first diffusion-preventing mask 5 and then heating the semiconductor substrate 10 coated with the solvent containing boron. Then the first diffusion-preventing mask 5 is removed using, for example, an aqueous hydrogen fluoride solution.

Figure 40:
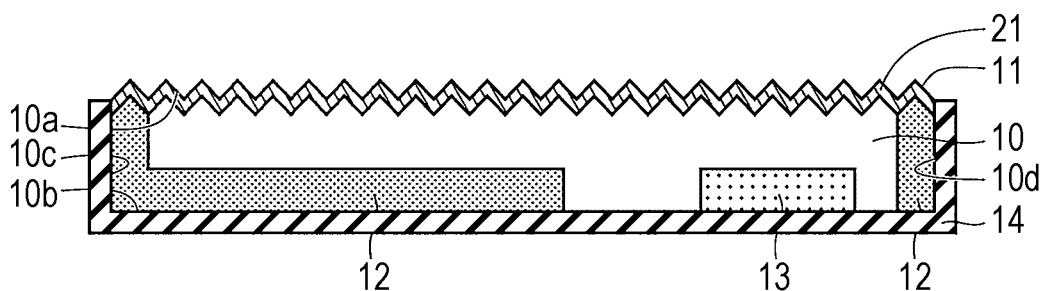
FIG. 40 is a schematic cross-sectional view showing the step next to the step shown in FIG. 39 in the method for producing the photoelectric conversion element according to embodiment 9.
Figure 41:
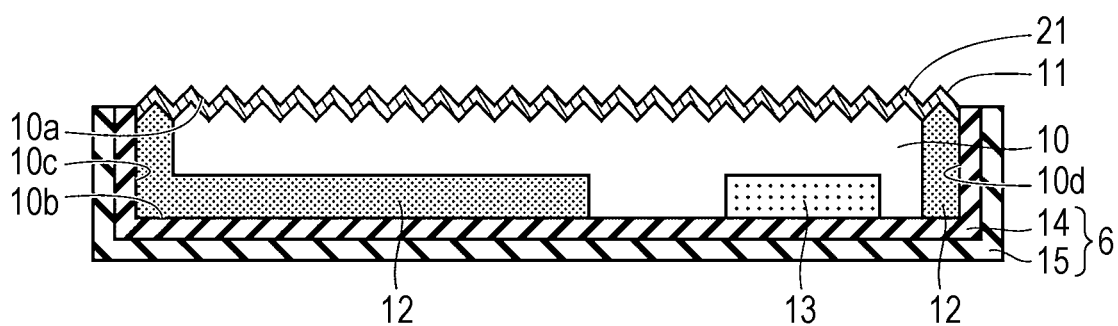
FIG. 41 is a schematic cross-sectional view showing the step next to the step shown in FIG. 40 in the method for producing the photoelectric conversion element according to embodiment 9.

Referring to FIGS. 40 and 41, the composite passivation film 6 is formed on the second surface 10b and side surfaces (e.g., the first side surface 10c and the second side surface 10d) of the semiconductor substrate 10 including the p-type impurity diffusion layer 12 and the n-type impurity diffusion layer 13 formed by diffusion. Specifically, referring to FIG. 40, the first passivation film 14 is formed on the second surface 10b and side surfaces (e.g., the first side surface 10c and the second side surface 10d) of the semiconductor substrate 10 including the p-type impurity diffusion layer 12 or the n-type impurity diffusion layer 13 formed by diffusion. The first passivation film 14 is formed of a material having negative fixed charges. The first passivation film 14 may be formed of aluminum oxide ($AlO_{x1}$) or hydrogenated aluminum oxide ($AlO_{x1}$:H). The first passivation film 14 may be formed using, for example, an atomic layer deposition (ALD) method, a sputtering method, or a plasma CVD method. Referring to FIG. 41, the protection film 15 is formed on the first passivation film 14. More specifically, the protection film 15 may be formed on side surfaces (e.g., the first side surface 10c and the second side surface 10d) of the semiconductor substrate in addition to the second surface 10b of the semiconductor substrate 10 including the p-type impurity diffusion layer 12 and the n-type impurity diffusion layer 13 formed by diffusion. The protection film 15 protects the first passivation film 14. The protection film 15 may be formed by, for example, a chemical vapor deposition (CVD) method or a sputtering method.

Figure 42:
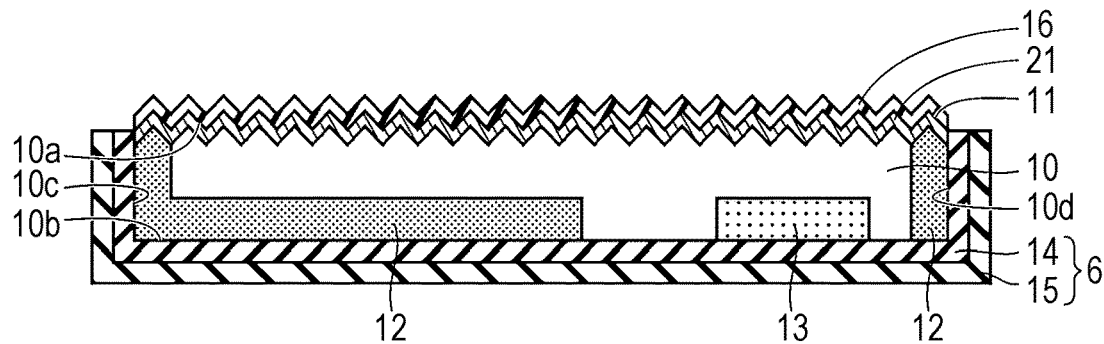
FIG. 42 is a schematic cross-sectional view showing the step next to the step shown in FIG. 41 in the method for producing the photoelectric conversion element according to embodiment 9.

Referring to FIG. 42, the second passivation film 16 may be formed on the first surface 10a of the semiconductor substrate 10. More specifically, the second passivation film 16 may be formed on the front surface field layer 21 formed on the first surface 10a of the semiconductor substrate 10. The second passivation film 16 may be formed using, for example, a chemical vapor deposition (CVD) method or a sputtering method. The second passivation film 16 has a refractive index between the refractive index of the semiconductor substrate 10 and the refractive index of a material such as air present around the photoelectric conversion element 3 and may function as an antireflection coating.

Figure 43:
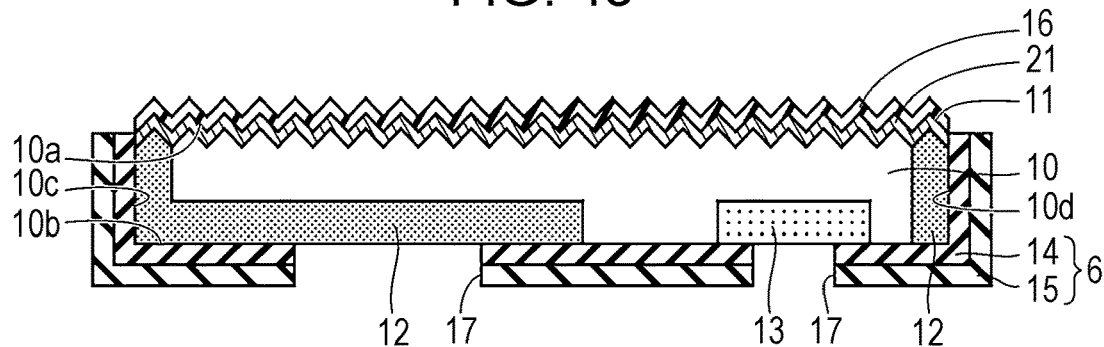
FIG. 43 is a schematic cross-sectional view showing the step next to the step shown in FIG. 42 in the method for producing the photoelectric conversion element according to embodiment 9.

Referring to FIG. 43, through holes 17 are formed in the composite passivation film 6. Then the first electrode 19 and the second electrode 18 are formed on the composite passivation film 6. The second electrode 18 is formed in one of the through holes 17 and electrically connected to the p-type impurity diffusion layer 12. The first electrode 19 is formed in the other through hole 17 and electrically connected to the n-type impurity diffusion layer 13. The photoelectric conversion element 3 in the present embodiment that is shown in FIG. 31 can thereby be produced.

The effects of the photoelectric conversion element 3 in the present embodiment will be described. The photoelectric conversion element 3 in the present embodiment has the following effects in addition to the effects of the photoelectric conversion element 1b in embodiment 2.

In the photoelectric conversion element 3 in the present embodiment, the p-type impurity diffusion layer 12 included in the semiconductor substrate 10 is disposed also in at least part of the side surfaces (e.g., the first side surface 10c and the second side surface 10d) of the semiconductor substrate 10. Therefore, in the photoelectric conversion element 3 in the present embodiment, the carrier collection efficiency of the photoelectric conversion element provided can be further improved.

For example, when the semiconductor substrate 10 is n-type, the pn junction is formed also near the side surfaces (e.g., the first side surface 10c and the second side surface 10d) of the semiconductor substrate 10, and the area of the pn junctions increases. This allows carriers generated near the side surfaces of the semiconductor substrate 10 by the light entering the photoelectric conversion element 3 to be collected efficiently. For example, when the semiconductor substrate 10 is p-type, the p-type impurity diffusion layer 12 disposed in at least part of the side surfaces (e.g., the first side surface 10c and the second side surface 10d) of the semiconductor substrate 10 may function as a side surface field layer. By the field effect of the p-type impurity diffusion layer 12 disposed in at least part of the side surfaces (e.g., the first side surface 10c and the second side surface 10d) of the semiconductor substrate 10, carriers generated in the photoelectric conversion element 3 by the light entering the photoelectric conversion element 3 can be prevented from recombining on the side surfaces (e.g., the first side surface 10c and the second side surface 10d) of the semiconductor substrate 10. Therefore, the carriers generated in the semiconductor substrate 10 by the light entering the photoelectric conversion element 3 can be efficiently collected.

Let $d_3$ be the thickness, from the second surface 10b of the semiconductor substrate 10, of the p-type impurity diffusion layer 12 on the side surfaces (e.g., the first side surface 10c and the second side surface 10d) of the semiconductor substrate 10 that include the p-type impurity diffusion layer 12. Let $d_4$ be the thickness, from the second surface 10b of the semiconductor substrate 10, of the p-type impurity diffusion layer 12 in a region that covers the second electrode 18 electrically connected to the p-type impurity diffusion layer 12 in plan view from the second surface 10b side of the semiconductor substrate 10. In the photoelectric conversion element 3 in the present embodiment, the thickness $d_3$ may be larger than the thickness $d_4$. The regions in which the p-type impurity diffusion layer 12 is formed can be extended in the thickness direction of the semiconductor substrate 10 (the direction in which the first surface 10a faces the second surface 10b). Therefore, carriers (e.g., holes, which are minority carriers) generated near the first surface 10a of the semiconductor substrate 10 can be efficiently collected. In the photoelectric conversion element 3 in the present embodiment, the carrier collection efficiency of the photoelectric conversion element provided can be further improved.

In the photoelectric conversion element 3 in the present embodiment, the first passivation film 14 having negative fixed charges may be disposed also on the side surfaces (e.g., the first side surface 10c and the second side surface 10d) of the semiconductor substrate 10 that include the p-type impurity diffusion layer 12. In the photoelectric conversion element 3 in the present embodiment, when the first passivation film 14 is disposed also on the side surfaces (e.g., the first side surface 10c and the second side surface 10d) of the semiconductor substrate 10 that include the p-type impurity diffusion layer 12, carriers generated in the photoelectric conversion element 3 when the photoelectric conversion element 3 is irradiated with light can be prevented from recombining on the side surfaces (e.g., the first side surface 10c and the second side surface 10d) of the semiconductor substrate 10. In the photoelectric conversion element 3 in the present embodiment, the carrier collection efficiency of the photoelectric conversion element provided can be further improved.

In the photoelectric conversion element 3 in the present embodiment, the protection film 15 may be disposed also on the side surfaces (e.g., the first side surface 10c and the second side surface 10d) that include the p-type impurity diffusion layer 12. The first passivation film 14 may be located between the protection film 15 and each of the side surfaces (e.g., the first side surface 10c and the second side surface 10d) that include the p-type impurity diffusion layer 12. On the side surfaces (e.g., the first side surface 10c and the second side surface 10d) of the semiconductor substrate 10 that include the p-type impurity diffusion layer 12, the protection film 15 covers the first passivation film 14. The protection film 15 can mechanically protect the first passivation film 14 from, for example, an impact applied from the outside of the photoelectric conversion element 3. The protection film 15 can prevent the first passivation film 14 from being peeled off the semiconductor substrate 10 during the production process of the photoelectric conversion element 3 and after its production. Therefore, the first passivation film 14 obtained has high film quality. In the photoelectric conversion element 3 in the present embodiment, the carrier collection efficiency of the photoelectric conversion element provided can be further improved.

Embodiment 10

Figure 44:
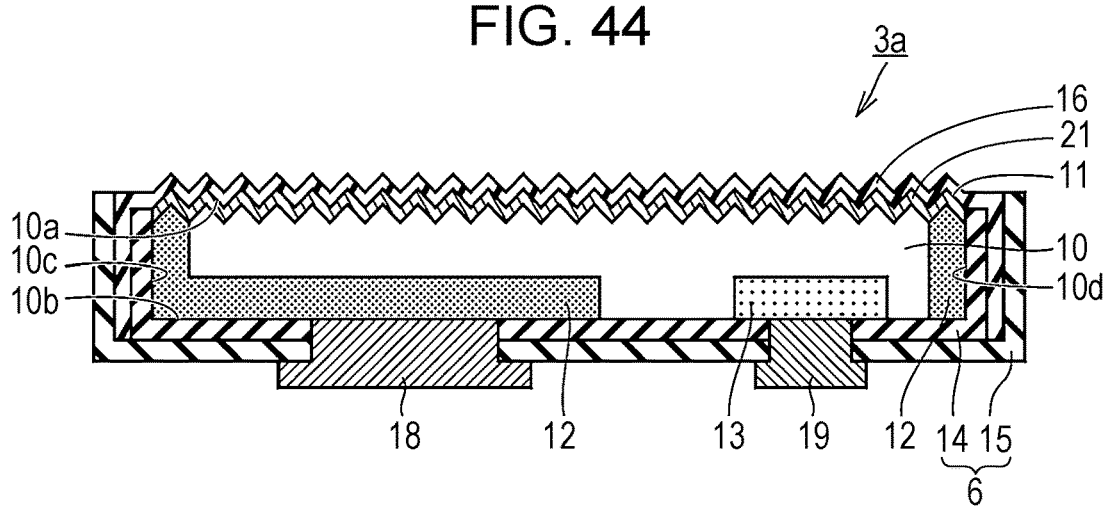
FIG. 44 is a schematic cross-sectional view of a photoelectric conversion element according to embodiment 10.

Referring to FIG. 44, a photoelectric conversion element 3a according to embodiment 10 will be described. The photoelectric conversion element 3a in the present embodiment has basically the same structure as the photoelectric conversion element 3 in embodiment 9 shown in FIG. 31 but differs from the photoelectric conversion element 3 mainly in the following respect.

In the photoelectric conversion element 3a according to the present embodiment, the second passivation film 16 is disposed on the first surface 10a of the semiconductor substrate 10 and on the side surfaces (e.g., the first side surface 10c and the second side surface 10d) of the semiconductor substrate 10 that include the p-type impurity diffusion layer 12. On the side surfaces (e.g., the first side surface 10c and the second side surface 10d) of the semiconductor substrate 10 that include the p-type impurity diffusion layer 12, the second passivation film 16 is located between the first passivation film 14 and the protection film 15. On the side surfaces (e.g., the first side surface 10c and the second side surface 10d) of the semiconductor substrate 10 that include the p-type impurity diffusion layer 12, the second passivation film 16 covers the first passivation film 14. On the side surfaces (e.g., the first side surface 10c and the second side surface 10d) of the semiconductor substrate 10 that include the p-type impurity diffusion layer 12, the protection film 15 covers the first passivation film 14 and the second passivation film 16.

Figure 45:
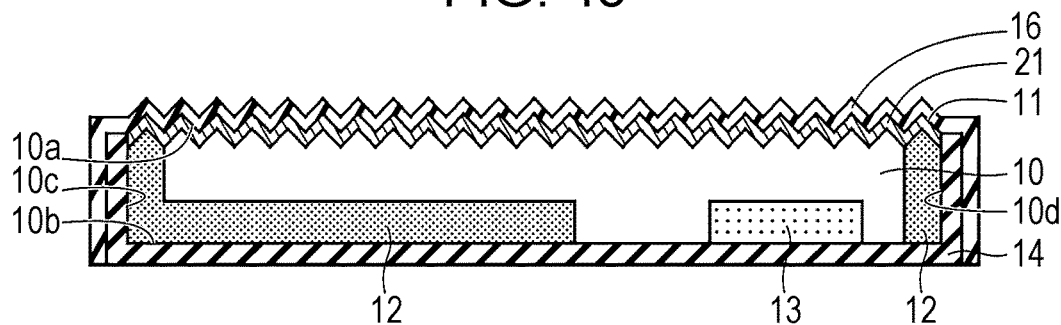
FIG. 45 is a schematic cross-sectional view showing a step in a method for producing the photoelectric conversion element according to embodiment 10.
Figure 46:
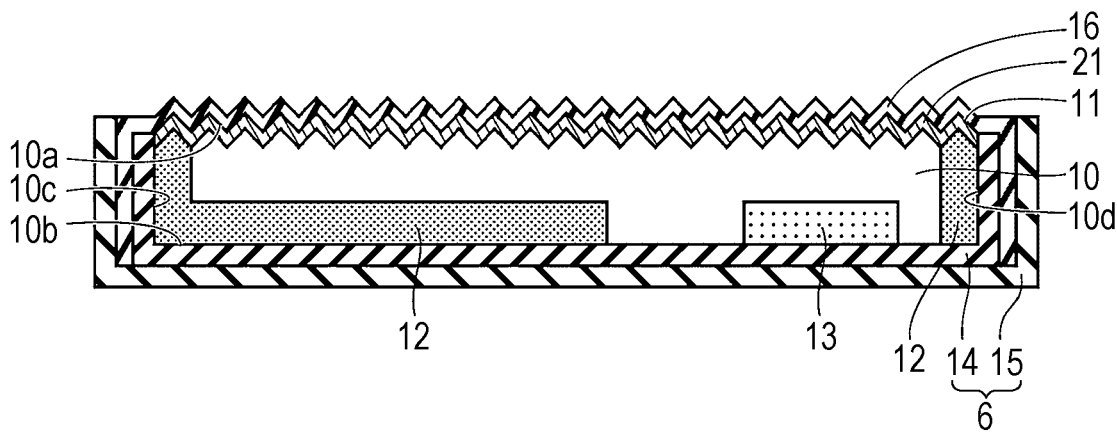
FIG. 46 is a schematic cross-sectional view showing the step next to the step shown in FIG. 45 in the method for producing the photoelectric conversion element according to embodiment 10.
Figure 47:
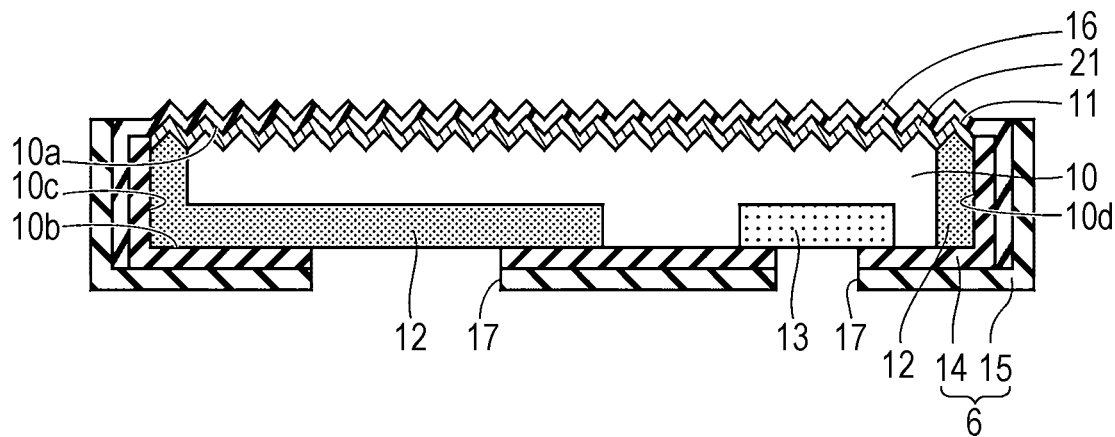
FIG. 47 is a schematic cross-sectional view showing the step next to the step shown in FIG. 46 in the method for producing the photoelectric conversion element according to embodiment 10.

Referring to FIG. 45 to FIG. 47, a method for producing the photoelectric conversion element 3a in the present embodiment will be described. The method for producing the photoelectric conversion element 3a in the present embodiment includes basically the same steps as the method for producing the photoelectric conversion element 3 in embodiment 9 shown in FIGS. 32 to 43 but differs from the method in embodiment 9 mainly in the following respects.

The method for producing the photoelectric conversion element 3a in the present embodiment includes the steps shown in FIGS. 32 to 40. The first passivation film 14 is formed on the second surface 10b, first side surface 10c, and second side surface 10d of the semiconductor substrate 10 through these steps.

Referring next to FIG. 45, the second passivation film 16 is formed on the first surface 10a of the semiconductor substrate 10 and on the side surfaces (e.g., the first side surface 10c and the second side surface 10d) of the semiconductor substrate 10 that include the p-type impurity diffusion layer 12. More specifically, the second passivation film 16 is formed on the front surface field layer 21 formed on the first surface 10a of the semiconductor substrate 10 and is also formed on the first passivation film 14 formed on the side surfaces (e.g., the first side surface 10c and the second side surface 10d) of the semiconductor substrate 10.

Referring to FIG. 46, the protection film 15 is formed on the second surface 10b of the semiconductor substrate 10 and on the side surfaces (e.g., the first side surface 10c and the second side surface 10d) of the semiconductor substrate 10 that include the p-type impurity diffusion layer 12. More specifically, the protection film 15 is formed on the first passivation film 14 formed on the second surface 10b of the semiconductor substrate 10 and is also formed on the second passivation film 16 formed on the side surfaces (e.g., the first side surface 10c and the second side surface 10d) of the semiconductor substrate 10.

Referring to FIG. 47, through holes 17 are formed in the composite passivation film 6. Then the first electrode 19 and the second electrode 18 are formed on the composite passivation film 6. The second electrode 18 is formed in one of the through holes 17 and electrically connected to the p-type impurity diffusion layer 12. The first electrode 19 is formed in the other through hole 17 and electrically connected to the n-type impurity diffusion layer 13. The photoelectric conversion element 3a in the present embodiment shown in FIG. 44 can thereby be produced.

The effects of the photoelectric conversion element 3a in the present embodiment will be described. The photoelectric conversion element 3a in the present embodiment has the following effects in addition to the effects of the photoelectric conversion element 3 in embodiment 9.

In the photoelectric conversion element 3a according to the present embodiment, on the side surfaces (e.g., the first side surface 10c and the second side surface 10d) of the semiconductor substrate 10 that include the p-type impurity diffusion layer 12, the second passivation film 16 is located between the first passivation film 14 and the protection film 15. The protection film 15 can mechanically protect the first passivation film 14 and the second passivation film 16 from, for example, an impact applied from the outside of the photoelectric conversion element 3a. The protection film 15 can prevent the first passivation film 14 and the second passivation film 16 from being peeled off the semiconductor substrate 10 during the production process of the photoelectric conversion element 3a and after its production. Since the layer (the second passivation film 16) that covers the side surfaces (e.g., the first side surface 10c and the second side surface 10d) of the semiconductor substrate 10 from the first surface 10a side of the semiconductor substrate 10 and the layers (the first passivation film 14 and the protection film 15) that cover the side surfaces (e.g., the first side surface 10c and the second side surface 10d) of the semiconductor substrate 10 from the second surface 10b side of the semiconductor substrate 10 are stacked in an alternating manner, the first passivation film 14 and the second passivation film 16 can be effectively prevented from being peeled off the semiconductor substrate 10. Therefore, the first passivation film 14 and second passivation film 16 obtained have high film quality. In the photoelectric conversion element 3a in the present embodiment, the carrier collection efficiency of the photoelectric conversion element provided can be further improved.

Embodiment 11

Figure 48:
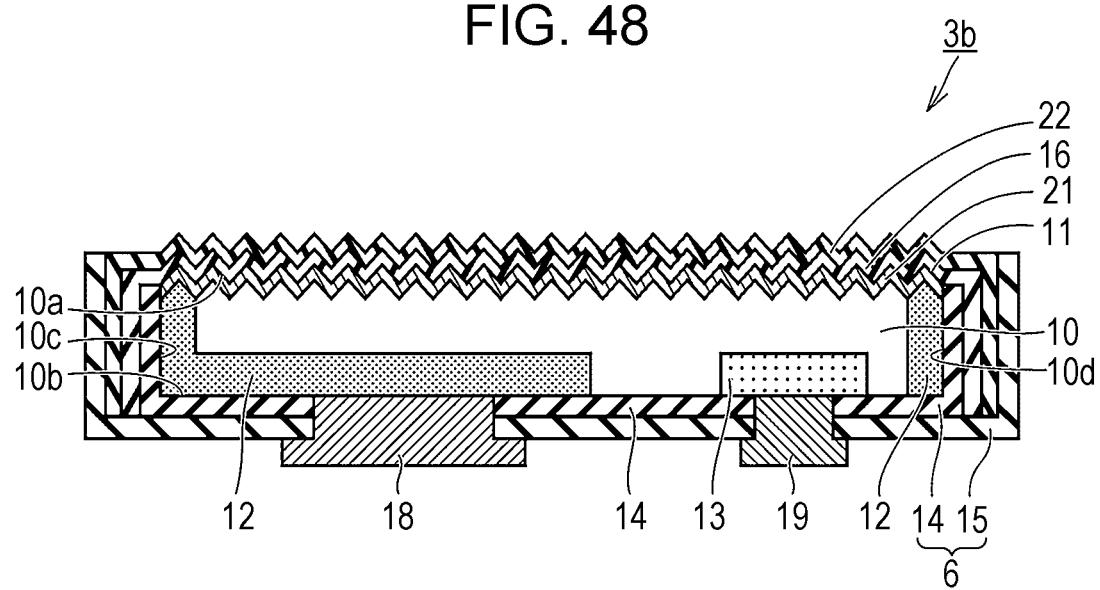
FIG. 48 is a schematic cross-sectional view of a photoelectric conversion element according to embodiment 11.

Referring to FIG. 48, a photoelectric conversion element 3b according to embodiment 11 will be described. The photoelectric conversion element 3b in the present embodiment has basically the same structure as the photoelectric conversion element 3a in embodiment 10 shown in FIG. 44 but differs from the photoelectric conversion element 3a mainly in the following respect.

The photoelectric conversion element 3b in the present embodiment further includes a first dielectric film 22 on the second passivation film 16. The second passivation film 16 has a refractive index that is larger than the refractive index of the first dielectric film 22 and smaller than the refractive index of the semiconductor substrate 10. The first dielectric film 22 may be formed of silicon nitride ($SiN_{x5}$), hydrogenated silicon nitride ($SiN_{x5}$:H), or silicon oxide ($SiO_{x5}$).

The effects of the photoelectric conversion element 3b in the present embodiment will be described. The photoelectric conversion element 3b in the present embodiment has the following effects in addition to the effects of the photoelectric conversion element 3a in embodiment 10.

The photoelectric conversion element 3b in the present embodiment may further include the dielectric film (the first dielectric film 22) on the second passivation film 16. In the photoelectric conversion element 3b in the present embodiment, the second passivation film 16 has a refractive index that is larger than the refractive index of the dielectric film (the first dielectric film 22) and smaller than the refractive index of the semiconductor substrate 10. Since the refractive index changes gently between the semiconductor substrate 10 and the outside of the photoelectric conversion element 3b, the reflectivity of light from the photoelectric conversion element 3c is further reduced, and a larger amount of light can enter the photoelectric conversion element 3c. In the photoelectric conversion element 3b in the present embodiment, the efficiency of the photoelectric conversion element provided in converting light energy into electric energy can be further improved.

Embodiment 12

Figure 49:
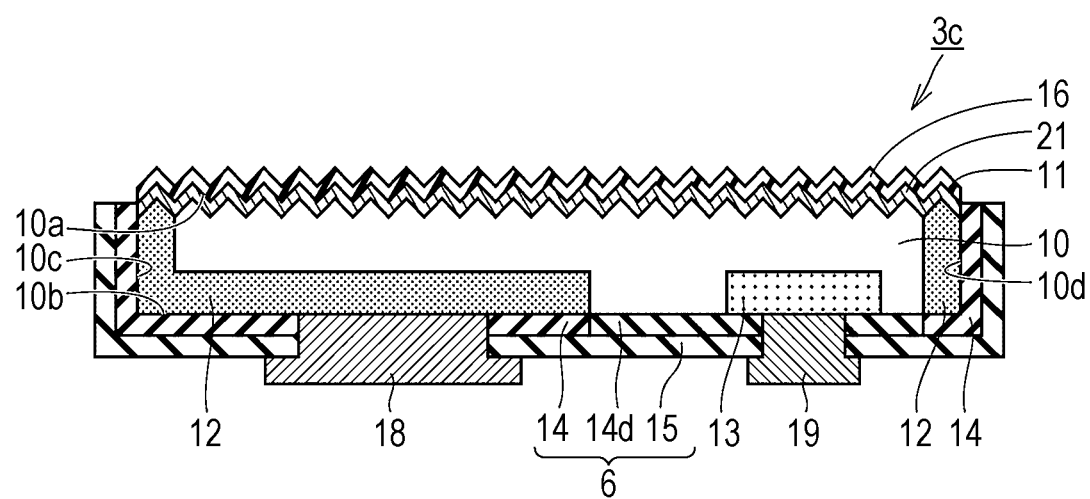
FIG. 49 is a schematic cross-sectional view of a photoelectric conversion element according to embodiment 12.

Referring to FIG. 49, a photoelectric conversion element 3c according to embodiment 11 will be described. The photoelectric conversion element 3c in the present embodiment has basically the same structure as the photoelectric conversion element 3 in embodiment 9 shown in FIG. 31 but differs from the photoelectric conversion element 3 mainly in the following respect.

In the photoelectric conversion element 3c in the present embodiment, the composite passivation film 6 further includes a third passivation film 14d having no negative fixed charges. The first passivation film 14 is disposed on the p-type impurity diffusion layer 12 in the second surface 10b of the semiconductor substrate 10, and the third passivation film 14d is disposed on the n-type impurity diffusion layer 13 in the second surface 10b of the semiconductor substrate 10. When the semiconductor substrate 10 is n-type, the third passivation film 14d having no negative fixed charges may be disposed also on portions of the second surface 10b of the semiconductor substrate 10 in which portions the p-type impurity diffusion layer 12 and the n-type impurity diffusion layer 13 are not formed.

The effects of the photoelectric conversion element 3c in the present embodiment will be described. The photoelectric conversion element 3c in the present embodiment has the following effects in addition to the effects of the photoelectric conversion element 3 in embodiment 9.

In the photoelectric conversion element 3c in the present embodiment, the first passivation film 14 having negative fixed charges is disposed on the p-type impurity diffusion layer 12 in the second surface 10b of the semiconductor substrate 10. Therefore, carriers (holes) generated in the semiconductor substrate 10 by the light entering through the first surface 10a of the semiconductor substrate 10 can be efficiently collected by the second electrode 18 electrically connected to the p-type impurity diffusion layer 12.

In the photoelectric conversion element 3c in the present embodiment, the third passivation film 14d having no negative fixed charges is disposed on the n-type impurity diffusion layer 13 in the second surface 10b of the semiconductor substrate 10. If a film having negative fixed charges is located on the n-type impurity diffusion layer 13, an inversion layer may be formed at the interface between the film having negative fixed charges and the n-type impurity diffusion layer 13, although this depends on the condition between the density of the negative fixed charges in the film having the negative fixed charges and the density of the n-type impurity in the n-type impurity diffusion layer 13. Therefore, the output power of the photoelectric conversion element may decrease. However, in the photoelectric conversion element 3c in the present embodiment, since the third passivation film 14d having no negative fixed charges is disposed on the n-type impurity diffusion layer 13 in the second surface 10b of the semiconductor substrate 10, the formation of an inversion layer at the interface between the third passivation film 14d and the n-type impurity diffusion layer 13 can be prevented. In the photoelectric conversion element 3c in the present embodiment, the output power of the photoelectric conversion element provided can be improved.

When the semiconductor substrate 10 is n-type, the third passivation film 14d having no negative fixed charges may be disposed also on portions of the second surface 10b of the semiconductor substrate 10 in which portions the p-type impurity diffusion layer 12 and the n-type impurity diffusion layer 13 are not formed. In this case, the formation of an inversion layer at the interface between the third passivation film 14d and the semiconductor substrate 10 can also be prevented. In the photoelectric conversion element 3c in the present embodiment, the output power of the photoelectric conversion element provided can be further improved.

In the photoelectric conversion element 3c in the present embodiment, the third passivation film 14d having no negative fixed charges may be a dielectric film having positive fixed charges. When the third passivation film 14d has positive fixed charges, carriers (electrons) generated in the semiconductor substrate 10 by the light entering through the first surface 10a of the semiconductor substrate 10 can be efficiently collected by the first electrode 19 electrically connected to the n-type impurity diffusion layer 13. In the photoelectric conversion element 3c in the present embodiment, the carrier collection efficiency of the photoelectric conversion element provided can be further improved.

A plurality of embodiments selected from embodiments 9 to 12 may be appropriately combined to form modifications of embodiments 9 to 12. For example, the composite passivation film 6 including the third passivation film 14d having no negative fixed charges in embodiment 12 may be applied to the photoelectric conversion elements 3, 3a, and 3b in embodiments 9 to 11. In the photoelectric conversion elements 3, 3a, 3b, and 3c in embodiments 9 to 12, the front surface field layer 21 may be omitted. In the photoelectric conversion elements 3, 3a, 3b, and 3c in embodiments 9 to 12, a second dielectric film 23 may be disposed between the first passivation film 14 and the second surface 10b of the semiconductor substrate 10, as shown in FIG. 15. In the photoelectric conversion elements 3, 3a, 3b, and 3c in embodiments 9 to 12, the p-type impurity diffusion layer 12 may be in contact with the n-type impurity diffusion layer 13, as shown in FIG. 19. In the photoelectric conversion element 3b in embodiment 11, the dielectric film (the first dielectric film 22) may be formed also on the side surfaces (the first side surface 10c and second side surface) of the semiconductor substrate 10 that include the p-type impurity diffusion layer 12 formed therein. In the photoelectric conversion elements 3, 3a, 3b, and 3c in embodiments 9 to 12, the p-type impurity diffusion layer 12 may be formed in at least one of the first side surface 10c and second side surface 10d of the semiconductor substrate 10. When the p-type impurity diffusion layer 12 is formed in one of the first side surface 10c and second side surface 10d of the semiconductor substrate 10, the first passivation film 14 may not be formed on the other one of the first side surface 10c and the second side surface 10d in which the p-type impurity diffusion layer 12 is not formed.

[Additional Remarks]

(1) A photoelectric conversion element disclosed in an embodiment comprises a semiconductor substrate having a first surface on which light is incident, a second surface opposite to the first surface, and a side surface that connects the first surface to the second surface. The semiconductor substrate includes an n-type impurity diffusion layer and a p-type impurity diffusion layer that are located in the second surface. The photoelectric conversion element disclosed in this embodiment further comprises a composite passivation film disposed on the second surface. The composite passivation film includes a first passivation film having negative fixed charges and a protection film that protects the first passivation film. The photoelectric conversion element disclosed in this embodiment further comprises a first electrode disposed on the second surface and electrically connected to the n-type impurity diffusion layer and a second electrode disposed on the second surface and electrically connected to the p-type impurity diffusion layer. In the photoelectric conversion element disclosed in this embodiment, the carrier collection efficiency of the photoelectric conversion element provided can be improved.

(2) In the photoelectric conversion element disclosed in this embodiment, the p-type impurity diffusion layer included in the semiconductor substrate may be disposed also in at least part of the side surface of the semiconductor substrate. Therefore, in the photoelectric conversion element disclosed in this embodiment, the carrier collection efficiency of the photoelectric conversion element provided can be further improved. For example, when the semiconductor substrate is n-type, the pn junction is formed also near the side surface of the semiconductor substrate, and the area of the pn junctions increases. This allows carriers generated near the side surface of the semiconductor substrate by light entering the photoelectric conversion element to be efficiently collected. For example, when the semiconductor substrate is p-type, the p-type impurity diffusion layer disposed in at least part of the side surface of the semiconductor substrate may function as a side surface field layer. By the field effect of the p-type impurity diffusion layer disposed in at least part of the side surface of the semiconductor substrate, carries generated in the photoelectric conversion element by the light entering the photoelectric conversion element can be prevented from recombining on the side surface of the semiconductor substrate. Therefore, the carriers generated in the semiconductor substrate by the light entering the photoelectric conversion element can be collected efficiently.

(3) In the photoelectric conversion element disclosed in this embodiment, the thickness, from the second surface, of the p-type impurity diffusion layer on the side surface of the semiconductor substrate 10 which side surface includes the p-type impurity diffusion layer may be larger than the thickness, from the second surface, of the p-type impurity diffusion layer in a region that covers the second electrode in plan view from the second surface side of the semiconductor substrate. In the photoelectric conversion element disclosed in this embodiment, the regions in which the p-type impurity diffusion layer is formed can be extended in the thickness direction of the semiconductor substrate 10 (the direction in which the first surface faces the second surface). Therefore, carriers (e.g., holes, which are minority carriers) generated near the first surface of the semiconductor substrate can be efficiently collected. In the photoelectric conversion element disclosed in this embodiment, the carrier collection efficiency of the photoelectric conversion element provided can be further improved.

(4) In the photoelectric conversion element disclosed in this embodiment, the first passivation film having negative fixed charges may be disposed also on the side surface of the semiconductor substrate which side surface includes the p-type impurity diffusion layer. In the photoelectric conversion element disclosed in this embodiment, when the first passivation film having negative fixed charges is disposed also on the side surface of the semiconductor substrate which includes the p-type impurity diffusion layer, carries generated in the photoelectric conversion element when the photoelectric conversion element is irradiated with light are prevented from recombining on the side surface of the semiconductor substrate. In the photoelectric conversion element disclosed in this embodiment, the carrier collection efficiency of the photoelectric conversion element provided can be further improved.

(5) In the photoelectric conversion element disclosed in this embodiment, the protection film is disposed also on the side surface of the semiconductor substrate which side surface includes the p-type impurity diffusion layer, and the first passivation film is located between the protection film and the side surface of the semiconductor substrate which side surface includes the p-type impurity diffusion layer. Since the first passivation film is located between the protection film and the side surface of the semiconductor substrate which includes the p-type impurity diffusion layer, the protection film can mechanically protect the first passivation film and the second passivation film from, for example, an impact applied from the outside of the photoelectric conversion element. The protection film can prevent the first passivation film and the second passivation film from being peeled off the semiconductor substrate during a production process of the photoelectric conversion element and after its production. Therefore, the first passivation film and second passivation film obtained have high film quality. In the photoelectric conversion element disclosed in this embodiment, the carrier collection efficiency of the photoelectric conversion element provided can be further improved.

(6) The photoelectric conversion element disclosed in this embodiment may further comprise a second passivation film disposed on the first surface of the semiconductor substrate. When the second passivation film is disposed on the first surface of the semiconductor substrate, carries generated in the photoelectric conversion element when the photoelectric conversion element is irradiated with light can be prevented from recombining on the first surface of the semiconductor substrate. In the photoelectric conversion element disclosed in this embodiment, the carrier collection efficiency of the photoelectric conversion element provided can be further improved.

(7) In the photoelectric conversion element disclosed in this embodiment, the second passivation film may be disposed also on the side surface of the semiconductor substrate which side surface includes the p-type impurity diffusion layer. On the side surface of the semiconductor substrate which side surface includes the p-type impurity diffusion layer, the second passivation film may be located between the first passivation film and the protection film. When the second passivation film is disposed on the first surface of the semiconductor substrate, carries generated in the photoelectric conversion element when the photoelectric conversion element is irradiated with light can be prevented from recombining on the first surface of the semiconductor substrate. In the photoelectric conversion element disclosed in this embodiment, the carrier collection efficiency of the photoelectric conversion element provided can be further improved.

In the photoelectric conversion element disclosed in this embodiment, on the side surface of the semiconductor substrate which includes the p-type impurity diffusion layer, the second passivation film is located between the first passivation film and the protection film. Therefore, the protection film can mechanically protect the first passivation film and the second passivation film from, for example, an impact applied from the outside of the photoelectric conversion element. The protection film can prevent the first passivation film and the second passivation film from being peeled off the semiconductor substrate during the production process of the photoelectric conversion element disclosed in this embodiment and after its production. Since the layer (the second passivation film) that covers the side surface of the semiconductor substrate from the first surface side of the semiconductor substrate and the layers (the first passivation film and the protection film) that cover the side surface of the semiconductor substrate from the second surface side of the semiconductor substrate are stacked in an alternating manner, the first passivation film and the second passivation film can be effectively prevented from being peeled off the semiconductor substrate. Therefore, the first passivation film and second passivation film obtained have high film quality. In the photoelectric conversion element disclosed in this embodiment, the carrier collection efficiency of the photoelectric conversion element provided can be further improved.

(8) The photoelectric conversion element disclosed in this embodiment may further comprise a dielectric film on the second passivation film. The second passivation film may have a refractive index that is larger than the refractive index of the dielectric film and smaller than the refractive index of the semiconductor substrate. In the photoelectric conversion element disclosed in this embodiment, since the refractive index changes gently between the semiconductor substrate and the outside of the photoelectric conversion element, the reflectivity of light from the photoelectric conversion element is further reduced, and a larger amount of light can enter the photoelectric conversion element. In the photoelectric conversion element disclosed in this embodiment, the efficiency of the photoelectric conversion element provided in converting light energy into electric energy can be further improved.

(9) In the photoelectric conversion element disclosed in this embodiment, the n-type impurity diffusion layer included in the semiconductor substrate may be disposed also in at least part of the side surface of the semiconductor substrate. Therefore, in the photoelectric conversion element disclosed in this embodiment, the carrier collection efficiency of the photoelectric conversion element provided can be further improved. For example, when the semiconductor substrate is n-type, the n-type impurity diffusion layer disposed in at least part of the side surface of the semiconductor substrate may function as a side surface field layer. By the field effect of the n-type impurity diffusion layer disposed in at least part of the side surface of the semiconductor substrate, carries generated in the photoelectric conversion element by the light entering the photoelectric conversion element can be prevented from recombining on the side surface of the semiconductor substrate. Therefore, the carriers generated in the semiconductor substrate by the light entering the photoelectric conversion element can be efficiently collected. For example, when the semiconductor substrate is p-type, the pn junction is formed also near the side surface of the semiconductor substrate, and the area of the pn junction increases. This allows the carriers generated near the side surface of the semiconductor substrate 10 by the light entering the photoelectric conversion element to be efficiently collected.

(10) In the photoelectric conversion element disclosed in this embodiment, the thickness, from the second surface of the semiconductor substrate, of the n-type impurity diffusion layer on the side surface of the semiconductor substrate 10 which side surface includes the n-type impurity diffusion layer may be larger than the thickness, from the second surface of the semiconductor substrate, of the n-type impurity diffusion layer in a region that covers the first electrode in plan view from the second surface side of the semiconductor substrate. In the photoelectric conversion element disclosed in this embodiment, the regions in which the n-type impurity diffusion layer is formed can be extended in the thickness direction of the semiconductor substrate 10 (the direction in which the first surface faces the second surface). Therefore, carriers generated near the first surface of the semiconductor substrate can be efficiently collected. In the photoelectric conversion element disclosed in this embodiment, the carrier collection efficiency of the photoelectric conversion element provided can be further improved.

(11) The photoelectric conversion element disclosed in this embodiment may further comprise a second passivation film disposed on the first surface of the semiconductor substrate. When the second passivation film is disposed on the first surface of the semiconductor substrate, carries generated in the photoelectric conversion element when the photoelectric conversion element is irradiated with light can be prevented from recombining on the first surface of the semiconductor substrate. In the photoelectric conversion element disclosed in this embodiment, the carrier collection efficiency of the photoelectric conversion element provided can be further improved. When the second passivation film is disposed also on the side surface of the semiconductor substrate which side surface includes the n-type impurity diffusion layer, carries generated in the photoelectric conversion element when the photoelectric conversion element is irradiated with light can be prevented from recombining on the side surface of the semiconductor substrate. In the photoelectric conversion element disclosed in this embodiment, the carrier collection efficiency of the photoelectric conversion element provided can be further improved.

(12) The photoelectric conversion element disclosed in this embodiment may further comprise a dielectric film on the second passivation film. The second passivation film has a refractive index that is larger than the refractive index of the dielectric film and smaller than the refractive index of the semiconductor substrate. In the photoelectric conversion element disclosed in this embodiment, since the refractive index changes gently between the semiconductor substrate and the outside of the photoelectric conversion element, the reflectivity of light from the photoelectric conversion element disclosed in this embodiment can be further reduced, and a larger amount of light can enter the photoelectric conversion element disclosed in this embodiment. In the photoelectric conversion element disclosed in this embodiment, the efficiency of the photoelectric conversion element provided in converting light energy into electric energy can be further improved.

(13) In the photoelectric conversion element disclosed in this embodiment, the second passivation film may be disposed also on the side surface of the semiconductor substrate which side surface includes the n-type impurity diffusion layer. When the second passivation film is disposed also on the side surface of the semiconductor substrate which includes the n-type impurity diffusion layer, carries generated in the photoelectric conversion element when the photoelectric conversion element is irradiated with light can be prevented from recombining on the side surface of the semiconductor substrate. In the photoelectric conversion element in the present embodiment, the carrier collection efficiency of the photoelectric conversion element provided can be further improved.

(14) In the photoelectric conversion element disclosed in this embodiment, the protection film may be disposed also on the side surface of the semiconductor substrate which side surface includes the n-type impurity diffusion layer. The second passivation film may be located between the protection film and the side surface of the semiconductor substrate which side surface includes the n-type impurity diffusion layer. The protection film can mechanically protect the first passivation film and the second passivation film from, for example, an impact applied from the outside of the photoelectric conversion element disclosed in this embodiment. The protection film can prevent the first passivation film and the second passivation film from being peeled off the semiconductor substrate during the production process of the photoelectric conversion element disclosed in this embodiment and after its production. Therefore, the first passivation film 14 and second passivation film 16 obtained have high film quality. In the photoelectric conversion element disclosed in this embodiment, the carrier collection efficiency of the photoelectric conversion element provided can be further improved.

(15) In the photoelectric conversion element disclosed in this embodiment, the composite passivation film may further include a third passivation film having no negative fixed charges. The first passivation film may be disposed on the p-type impurity diffusion layer in the second surface of the semiconductor substrate, and the third passivation film may be disposed on the n-type impurity diffusion layer in the second surface of the semiconductor substrate. Since the first passivation film having negative fixed charges is disposed on the p-type impurity diffusion layer in the second surface of the semiconductor substrate, carriers (holes) generated in the semiconductor substrate by the light entering through the first surface of the semiconductor substrate can be efficiently collected by the second electrode electrically connected to the p-type impurity diffusion layer. Since the third passivation film having no negative fixed charges is disposed on the n-type impurity diffusion layer in the second surface of the semiconductor substrate, the formation of an inversion layer at the interface between the third passivation film and the n-type impurity diffusion layer can be prevented. In the photoelectric conversion element disclosed in this embodiment, the output power of the photoelectric conversion element provided can be improved.

(16) The photoelectric conversion element disclosed in this embodiment may further comprise a front surface field layer on the first surface of the semiconductor substrate. The front surface field layer functions as a front surface field barrier that prevents carriers generated in the semiconductor substrate and diffusing toward the first surface serving as the light-receiving surface from recombining near the first surface. In the photoelectric conversion element disclosed in this embodiment, the carrier collection efficiency of the photoelectric conversion element provided can be further improved.

(17) In the photoelectric conversion element disclosed in this embodiment, the p-type impurity diffusion layer may be in contact with the n-type impurity diffusion layer. This can increase the area of the pn junction at the interface between the p-type impurity diffusion layer or the n-type impurity diffusion layer and a region of the semiconductor substrate in which region the p-type impurity diffusion layer and the n-type impurity diffusion layer are not formed. In the photoelectric conversion element disclosed in this embodiment, the carrier collection efficiency of the photoelectric conversion element provided can be further improved.

It should be understood that the embodiments disclosed herein are illustrative and nonrestrictive in every respect. The scope of the present invention is defined not by the preceding description but by the scope of the claims and is intended to include any modifications within the scope and meaning equivalent to the scope of the claims.

REFERENCE SIGNS LIST 1, 1a, 1b, 1c, 1d, 1e, 2, 2a, 2b, 3, 3a, 3b, 3c photoelectric conversion element, 4 etching protection film, 5 first diffusion-preventing mask, 5a, 7a opening, 6 composite passivation film, 7 second diffusion-preventing mask, 8 first mask, 10 semiconductor substrate, 10a first surface, 10b second surface, 10c first side surface, 10d second side surface, 11 textured structure, 12 p-type impurity diffusion layer, 13 n-type impurity diffusion layer, 14 first passivation film, 14d third passivation film, 15 protection film, 16 second passivation film, 17 through hole, 18 second electrode, 19 first electrode, 21 front surface field layer, 22 first dielectric film, 23 second dielectric film, 26 first etching paste, 27 second etching paste

The invention claimed is:

1. A photoelectric conversion element comprising:
a semiconductor substrate having a first surface on which light is incident, a second surface opposite to the first surface, and a side surface that connects the first surface to the second surface, the semiconductor substrate including an n-type impurity diffusion layer and a p-type impurity diffusion layer that are located in the second surface;
a composite passivation film disposed on the second surface, the composite passivation film including a first passivation film having negative fixed charges and a protection film that protects the first passivation film;
a first electrode disposed on the second surface and electrically connected to the n-type impurity diffusion layer;
a second electrode disposed on the second surface and electrically connected to the p-type impurity diffusion layer,
wherein the p-type impurity diffusion layer included in the semiconductor substrate is disposed also in at least part of the side surface,
the thickness, from the second surface, of the p-type impurity diffusion layer in the side surface is larger than the thickness, from the second surface, of the p-type impurity diffusion layer in a region that covers the second electrode in plan view from the second surface side,
the first passivation film is disposed also on the side surface that includes the p-type impurity diffusion layer, and
the first passivation film continuously extends from the second electrode to the side surface that includes the p-type impurity diffusion layer.

2. The photoelectric conversion element according to claim 1, wherein the protection film is disposed also on the side surface that includes the p-type impurity diffusion layer, and
wherein the first passivation film is located between the protection film and the side surface that includes the p-type impurity diffusion layer.

3. The photoelectric conversion element according to claim 1, further comprising a second passivation film disposed on the first surface.

4. The photoelectric conversion element according to claim 3, wherein the second passivation film is disposed also on the side surface that includes the p-type impurity diffusion layer, and
wherein, on the side surface that includes the p-type impurity diffusion layer, the second passivation film is located between the first passivation film and the protection film.

5. The photoelectric conversion element according to claim 3, further comprising a dielectric film on the second passivation film,
wherein the second passivation film has a refractive index that is larger than the refractive index of the dielectric film and smaller than the refractive index of the semiconductor substrate.

6. The photoelectric conversion element according to claim 5, wherein the dielectric film is formed of silicon nitride ($SiN_{x5}$), hydrogenated silicon nitride ($SiN_{x5}$:H), or silicon oxide ($SiO_{x5}$).

7. The photoelectric conversion element according to claim 3, wherein the composite passivation film further includes a third passivation film having no negative fixed charges,
wherein the first passivation film is disposed on the p-type impurity diffusion layer in the second surface, and
wherein the third passivation film is disposed on the n-type impurity diffusion layer in the second surface.

8. The photoelectric conversion element according to claim 7, wherein the third passivation film is formed of silicon nitride ($SiN_{x2}$) or hydrogenated silicon nitride ($SiN_{x2}$:H).

9. The photoelectric conversion element according to claim 3, wherein the second passivation film is formed of silicon nitride ($SiN_{x4}$) or hydrogenated silicon nitride ($SiN_{x4}$:H).

10. The photoelectric conversion element according to claim 1, further comprising a front surface field layer on the first surface.

11. The photoelectric conversion element according to claim 1, wherein the p-type impurity diffusion layer is in contact with the n-type impurity diffusion layer.

12. The photoelectric conversion element according to claim 1, wherein the first passivation film is formed of aluminum oxide ($AlO_{x1}$) or hydrogenated aluminum oxide ($AlO_{x1}$:H).

13. The photoelectric conversion element according to claim 1, wherein the protection film is formed of silicon oxide ($SiO_{x3}$), silicon nitride ($SiN_{x3}$), or hydrogenated silicon nitride ($SiN_{x3}$:H).

14. A photoelectric conversion element comprising:
a semiconductor substrate having a first surface on which light is incident, a second surface opposite to the first surface, and a side surface that connects the first surface to the second surface, the semiconductor substrate including an n-type impurity diffusion layer and a p-type impurity diffusion layer that are located in the second surface;
a composite passivation film disposed on the second surface, the composite passivation film including a first passivation film having negative fixed charges and a protection film that protects the first passivation film;
a first electrode disposed on the second surface and electrically connected to the n-type impurity diffusion layer;
a second electrode disposed on the second surface and electrically connected to the p-type impurity diffusion layer; and
a second passivation film disposed on the first surface,
wherein the n-type impurity diffusion layer included in the semiconductor substrate is disposed also in at least part of the side surface,
the thickness, from the second surface, of the n-type impurity diffusion layer in the side surface is larger than the thickness, from the second surface, of the n-type impurity diffusion layer in a region that covers the first electrode in plan view from the second surface side,
the second passivation film is disposed also on the side surface that includes the n-type impurity diffusion layer,
the protection film is disposed also on the side surface that includes the n-type impurity diffusion layer,
the second passivation film is located between the protection film and the side surface that includes the n-type impurity diffusion layer, and
the protection film continuously extends from the second electrode to the second passivation film on the side surface that includes the n-type impurity diffusion layer.

15. The photoelectric conversion element according to claim 14, further comprising a dielectric film on the second passivation film,
wherein the second passivation film has a refractive index that is larger than the refractive index of the dielectric film and smaller than the refractive index of the semiconductor substrate.

16. The photoelectric conversion element according to claim 15, wherein the dielectric film is formed of silicon nitride ($SiN_{x5}$), hydrogenated silicon nitride ($SiN_{x5}$:H), or silicon oxide ($SiO_{x5}$).

17. The photoelectric conversion element according to claim 14, wherein the second passivation film is formed of silicon nitride ($SiN_{x4}$) or hydrogenated silicon nitride ($SiN_{x4}$:H).

18. The photoelectric conversion element according to claim 14, wherein the composite passivation film further includes a third passivation film having no negative fixed charges,
wherein the first passivation film is disposed on the p-type impurity diffusion layer in the second surface, and
wherein the third passivation film is disposed on the n-type impurity diffusion layer in the second surface.

* * * * *